United States Patent
Kemmochi et al.

(10) Patent No.: US 9,531,338 B2
(45) Date of Patent: Dec. 27, 2016

(54) SIGNAL PROCESSING APPARATUS, SIGNAL PROCESSING METHOD, PROGRAM, SIGNAL PROCESSING SYSTEM, AND COMMUNICATION TERMINAL

(71) Applicant: SONY CORPORATION, Tokyo (JP)

(72) Inventors: Chisato Kemmochi, Kanagawa (JP); Keisuke Touyama, Tokyo (JP); Akira Inoue, Tokyo (JP)

(73) Assignee: SONY CORPORATION, Tokyo (JP)

( * ) Notice: Subject to any disclaimer, the term of this patent is extended or adjusted under 35 U.S.C. 154(b) by 437 days.

(21) Appl. No.: 13/756,975

(22) Filed: Feb. 1, 2013

(65) Prior Publication Data

US 2013/0202131 A1    Aug. 8, 2013

(30) Foreign Application Priority Data

Feb. 3, 2012    (JP) ................. 2012-022536

(51) Int. Cl.
| | |
|---|---|
| H03G 3/00 | (2006.01) |
| H03G 5/00 | (2006.01) |
| H03G 5/16 | (2006.01) |
| H03G 9/00 | (2006.01) |
| H03G 9/02 | (2006.01) |
| H04R 25/00 | (2006.01) |

(52) U.S. Cl.
CPC ................. *H03G 3/00* (2013.01); *H03G 5/005* (2013.01); *H03G 5/165* (2013.01); *H03G 9/005* (2013.01); *H03G 9/025* (2013.01); *H04R 25/558* (2013.01); *H04R 25/505* (2013.01)

(58) Field of Classification Search
CPC . H04R 2430/01; H04R 25/505; H04R 25/558; H04R 25/30; H04R 25/356; H03G 5/165; H03G 5/02; H03G 5/00; H03G 5/025; H03G 9/00; H03G 9/005; H03G 9/025; H03G 9/02; H03G 1/02
USPC ................. 381/101, 102, 104–106, 109, 315, 314,381/60, 56, 57
See application file for complete search history.

(56) References Cited

U.S. PATENT DOCUMENTS 8,073,160 B1* 12/2011 Classen .................... 381/119
2005/0080500 A1* 4/2005 Kimura .................... 700/94
(Continued)

FOREIGN PATENT DOCUMENTS

| JP | 06-242794 | 9/1994 |
| JP | 2006-345025 A | 12/2006 |
| JP | 2010-177961 A | 8/2010 |

OTHER PUBLICATIONS

Yoshinobu Watanabe, et al., "Investigation of Fitness Inference Method Following the Change of Evaluation Criterion in Hearing Aid Adjustment Support System using Interactive Evolutionary Computation", 22nd Fuzzy System Symposium, 6B4-2, Sapporo, Sep. 6-8, 2006, pp. 113-118.

(Continued)

*Primary Examiner* — Paul S Kim
*Assistant Examiner* — Sabrina Diaz
(74) *Attorney, Agent, or Firm* — Oblon, McClelland, Maier & Neustadt, L.L.P.

(57) ABSTRACT

There is provided a signal processing apparatus including a provision control unit that provides choices expressed subjectively and associated with control for an acoustic signal, and an output unit that outputs a predetermined choice selected from the provided choices.

12 Claims, 23 Drawing Sheets

(56) References Cited

U.S. PATENT DOCUMENTS

2009/0307594 A1* 12/2009 Kosonen .............. G10H 1/0008
　　　　　　　　　　　　　　　　　　　　　　　　715/727
2010/0290654 A1* 11/2010 Wiggins ................ H04R 25/70
　　　　　　　　　　　　　　　　　　　　　　　　381/314

OTHER PUBLICATIONS

Japanese Office Action mailed Sep. 29, 2015 in Japanese Patent Application No. 2012-022536.
Office Action issued Mar. 22, 2016 in Japanese Patent Application No. 2012-022536.

* cited by examiner

FIG. 11

| EXPRESSION OF SUBJECTIVE SENSE | EXPRESSION OF SUBJECTIVE REQUEST |
|---|---|
| • NOISE<br>• LOUD<br>• SHRILL<br>• JINGLING<br>• RUSTLING<br>• RATTLING<br>• PLOCK<br>• CRUNCHING<br>• CRISP<br>• RESOUNDING<br>• TUMULTUOUS<br>• UPROARIOUS<br>• RUSHING<br>• QUICKLY<br>• GEE-GEE<br>• EXCITING<br>• GRITTY<br>• BUZZING<br>• ECHOIC<br>• KEEN<br>• BURST<br>• DENSELY<br>• MUMBLING<br>• QUIET<br>• THICKLY<br>• SOUND HEARD FROM FAR PLACE<br>• SOUND HEARD FROM NEAR PLACE | • DESIRE TO LISTEN TO SOUND<br>• DESIRE TO SUPPRESS NOISE<br>• DESIRE TO LISTEN TO MUSIC<br>• DESIRE TO SEE MOVIE<br>• DESIRE TO LISTEN TO LIVE CONTENT<br>• DESIRE TO SEE PLAY<br>• DESIRE TO WATCH SPORT GAME<br>• DESIRE TO SUPPRESS SNIFFLE<br>• DESIRE TO SUPPRESS SOUND OF CHEWING GUM<br>• DESIRE TO SUPPRESS SOUND OF SLURPING FOOD<br>• DESIRE TO SUPPRESS FOOTSTEP<br>• DESIRE TO SUPPRESS SOUND OF PRESSING KEY |

310: HEARING AID

WIRED CONNECTION

FIG. 24
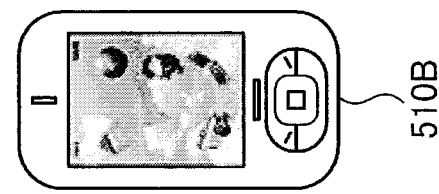
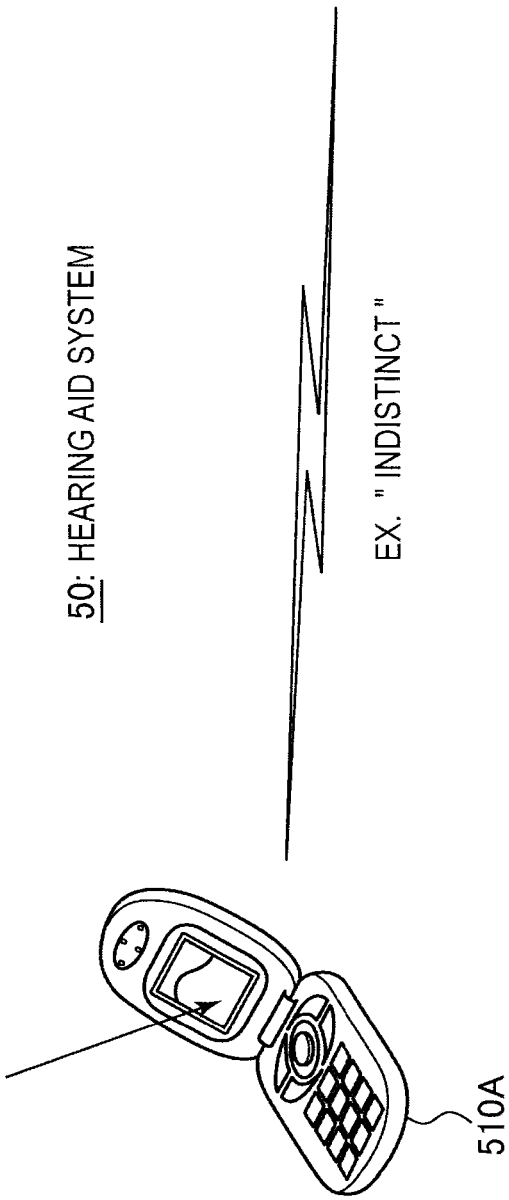
50: HEARING AID SYSTEM
EX. "INDISTINCT"

SIGNAL PROCESSING APPARATUS, SIGNAL PROCESSING METHOD, PROGRAM, SIGNAL PROCESSING SYSTEM, AND COMMUNICATION TERMINAL

BACKGROUND

The present disclosure relates to a signal processing apparatus, a signal processing method, a program, a signal processing system, and a communication terminal. In particular, the present disclosure relates to a signal processing apparatus that adjusts the sound quality and the volume of an acoustic signal picked up by a microphone or reproduced.

In the related art, a mechanism for executing effect processing, for example, sound quality adjustment processing such as tone adjustment or a parametric equalizer and reverberation addition processing with respect to a reproduced sound as well as the volume and outputting a user's preference sound in an apparatus for reproducing a sound has been provided. This adjustment method has been a method of dividing a frequency into dozens of bands and adjusting gain for each band in the parametric equalizer or a method of providing a choice by a preset effect processing name, for example, a studio or live and reading a parameter of preset effect processing from a storage unit, according to an effect processing name selected by a user.

A user who knows much of the sound to some extent can determine an operation necessary for changing a sound to a desired sound, for example, how to operate a parameter of which frequency band to change the sound to the desired sound in the case of the parametric equalizer and fine adjustment is enabled when an operation parameter is segmented. However, when the user has no knowledge of adjusting a sound, it may be difficult for the user to determine how to adjust the sound to change the sound to the desired sound.

For this reason, in an apparatus or a program for reproducing a sound, several kinds of names according to the impression of an effect (hereinafter, referred to as effect names), for example, a hall and a stadium are prepared in a previously adjusted effect processing group, one of the effects names is selected, and the strength and weakness of the effect are adjusted in some cases, so that the sound is easily adjusted to the desired sound.

However, because the effect name does not necessarily correspond to the subjectivity of the user, the user should determine a selected effect name from the impression of the user after the user hears the sound. At that time, when the user has some knowledge and experience, for example, when, because a sound is shrill, the use desires to adjust the sound such that the sound is not shrill, the user should select an optimal effect from knowledge of determining what a reason of the shrill is and a past experience.

In the related art, a method of performing sound quality adjustment according to a subjective sense using interactive evolutionary computing and a genetic algorithm has been examined. For example, in "Verification of Evaluation Value Reasoning Method corresponding to Change of Evaluation Standard in Hearing Aid Fitting using Interactive Evolutionary Computing", 22nd Fuzzy System Symposium (Sapporo, Sep. 6-8, 2006), it has been reported by an experiment that there is a constant effect. In this method, a predetermined sound is provided to the user, an evaluation of the sound is obtained from the user, and an adjustment parameter is calculated. However, it has been difficult to adjust the sound with the subjectivity of the user with respect to the sound which the user hears.

SUMMARY

It is desirable to enable a user to subjectively adjust an acoustic signal picked up by a microphone or reproduced.

According to an embodiment of the present disclosure, there is provided a signal processing apparatus which includes a provision control unit that provides choices expressed subjectively and associated with control for an acoustic signal and an output unit that outputs a predetermined choice selected from the provided choices.

In the present disclosure, the provision control unit provides the choices that are associated with the control for the acoustic signal. The choices may be provided visually or aurally. For example, the provided choices may be subjective senses and/or subjective requests to be handled. The output unit outputs the predetermined choice that is selected from the provided choices. In this case, the output predetermined choice is used in the signal processing apparatus or an external apparatus.

As such, in the present disclosure, a user can select a predetermined choice that corresponds to subjectivity with respect to a hearing sound and output the predetermined choice. That is, the user can adjust the sound (the volume and the sound quality) with a subjective sense with respect to the sound.

In the present disclosure, the provision control unit may change a display aspect of the provided choices, according to the selected choice or a feature amount of an acoustic signal of a processing object. Thereby, the user can perform the sound adjustment based on the selection of the choice appropriately and efficiently.

In the present disclosure, the signal processing apparatus may further include a calculating unit that calculates an adjustment parameter to adjust an acoustic signal of a processing object, on the basis of individual parameters measured in advance, the selected predetermined choice, and a feature amount of the acoustic signal of the processing object. For example, the individual parameters may be parameters showing aural characteristics. The individual parameters may be parameters showing characteristics of a microphone and/or a speaker. In this case, when processing for adjusting the acoustic signal of the processing object is executed by an external apparatus, processing for calculating the adjustment parameter becomes unnecessary in the external apparatus and a processing load of the external apparatus can be decreased.

According to another embodiment of the present disclosure, there is provided a signal processing apparatus which includes an acquiring unit that acquires an adjustment parameter calculated on the basis of individual parameters measured in advance, a predetermined choice selected from choices expressed subjectively and associated with control for a provided acoustic signal, and a feature amount of an acoustic signal of a processing object and a signal processing unit that adjusts the acoustic signal of the processing object, on the basis of the acquired adjustment parameter.

In the present disclosure, the adjustment parameter is calculated by the acquiring unit. The adjustment parameter is calculated on the basis of the individual parameters measured in advance, the predetermined choice selected from choices expressed subjectively and associated with the control for the provided acoustic signal, and the feature amount of the acoustic signal of the processing object. The signal processing unit adjusts the acoustic signal of the processing object, on the basis of the acquired adjustment parameter.

As such, in the present disclosure, the acoustic signal is adjusted on the basis of the adjustment parameter to which the predetermined choice of the subjective expression selected by the user is reflected. Therefore, the user can adjust the sound (volume and the sound quality) with a subjective sense with respect to the sound.

In the present disclosure, the signal processing unit may have a first buffer and a second buffer that accumulate the adjustment parameter. When the adjustment parameter is acquired by the acquiring unit in a use state of the adjustment parameter accumulated in one buffer, the signal processing unit may accumulate the acquired adjustment parameter in the other buffer and switch the use state into a use state of the adjustment parameter accumulated in the other buffer. In this case, stop of adjustment processing with respect to the acoustic signal can be avoided and a break of the sound can be prevented.

In the present disclosure, the signal processing unit may have a buffer that accumulates the adjustment parameter. When the adjustment parameter is acquired by the acquiring unit in a use state of the adjustment parameter accumulated in the buffer, the signal processing unit may mute an output of the adjusted acoustic signal, accumulate the acquired adjustment parameter in the buffer, and release muting. In this case, abnormal noise can be prevented from being generated when the adjustment parameter is switched and the user can recognize switching of the adjustment parameter by the break of the sound.

In the present disclosure, the signal processing apparatus may further include an analyzing unit that analyzes the acoustic signal of the processing object and calculates a feature amount of the acoustic signal. In the present disclosure, the signal processing apparatus may further include a calculating unit that calculates the adjustment parameter.

According to another embodiment of the present disclosure, there is provided a signal processing apparatus which includes a sound input unit, an acquiring unit that acquires a command expressed subjectively and associated with control for an acoustic signal, from a sound input by the sound input unit, a calculating unit that calculates an adjustment parameter to adjust an acoustic signal of a processing object, on the basis of individual parameters measured in advance, the acquired command, and a feature amount of the acoustic signal of the processing object, and a signal processing unit that adjusts the acoustic signal of the processing object, on the basis of the calculated adjustment parameter.

In the present disclosure, the sound input unit is included. For example, the sound input unit may be configured using a microphone to obtain an acoustic signal of a processing object. The acquiring unit acquires a command expressed subjectively and associated with control for the acoustic signal, from the sound input by the sound input unit.

The calculating unit calculates the adjustment parameter to adjust the acoustic signal of the processing object, on the basis of the individual parameters measured in advance, the acquired command, and the feature amount of the acoustic signal of the processing object. The signal processing unit adjusts the acoustic signal of the processing object, on the basis of the calculated adjustment parameter.

As such, in the present disclosure, the user can input the subjective command by the sound. The acoustic signal is adjusted on the basis of the adjustment parameter to which the subjective command is reflected. Therefore, the user can adjust the sound (the volume and the sound quality) with a subjective sense with respect to the sound.

In the present disclosure, the signal processing apparatus may further include a first signal processing system and a second signal processing system each of which includes the sound input unit, the acquiring unit, the calculating unit, and the signal processing unit. One signal processing system may transmit a sound input to the sound input unit to the other signal processing system and receive a command from the other signal processing system. In this case, the command can be avoided from being obtained in an overlapped manner by the two signal processing systems and a processing load and consumption power can be decreased.

According to another embodiment of the present disclosure, there is provided a communication terminal which includes a provision control unit that provides choices expressed subjectively and associated with control for an acoustic signal, a command output unit that outputs a command corresponding to a predetermined choice selected from the provided choices, and a transmitting unit that transmits the output command to a communication partner.

In the present disclosure, the provision control unit provides the choices that are associated with the control for the acoustic signal. The choices may be provided visually or aurally. For example, the provided choices may be subjective senses and/or subjective requests to be handled. The command output unit outputs the command that corresponds to the predetermined choice selected from the provided choices. The command is transmitted to a communication partner by the transmitting unit.

As such, in the present disclosure, the user of the communication terminal can select the predetermined choice corresponding to the subjectivity with respect to the sound received from the communication partner and transmit the command corresponding to the predetermined choice to the communication partner. The user can instruct adjustment of the sound (the volume and the sound quality) transmitted from the communication partner with the subjective sense with respect to the sound. In this case, because the communication partner analyzes the command, the user can transmit a sound adjustment command, even if the user does not know the apparatus characteristic of the communication partner or the signal processing. Because the communication partner adjusts the sound, noise suppress processing can be executed efficiently before encoding.

The present disclosure may further include a receiving unit that receives an acoustic signal from a communication partner, a parameter calculating unit that calculates an adjustment parameter, on the basis of at least the command output from the command output unit, and a signal processing unit that adjusts the received acoustic signal, on the basis of the calculated adjustment parameter. For example, when the adjustment parameter is calculated, individual parameters (a parameter showing an aural characteristic and a parameter showing a characteristic of a microphone or a speaker) measured in advance or a feature amount of an acoustic signal of a processing object may be referred to.

According to another embodiment of the present disclosure, there is provided a communication terminal which includes a receiving unit that receives a command corresponding to a predetermined choice expressed subjectively and associated with control for an acoustic signal, from a communication partner, an acoustic signal input unit that inputs an acoustic signal, an adjustment parameter calculating unit that calculates an adjustment parameter, on the basis of at least the received command, a signal processing unit that adjusts the input acoustic signal, on the basis of the calculated adjustment parameter, and a transmitting unit that transmits the adjusted acoustic signal to the communication partner.

According to the embodiments of the present disclosure described above, a user can subjectively adjust an acoustic signal picked up by a microphone or reproduced.

BRIEF DESCRIPTION OF THE DRAWINGS

FIG. 11 is a diagram illustrating an example of subjective expressions with respect to sounds, which can become expressions of a subjective sense and a subjective request;

FIG. 24 is a diagram illustrating a configuration example of a communication system according to a fifth embodiment.

DETAILED DESCRIPTION OF THE EMBODIMENT(S)

Figure 1:
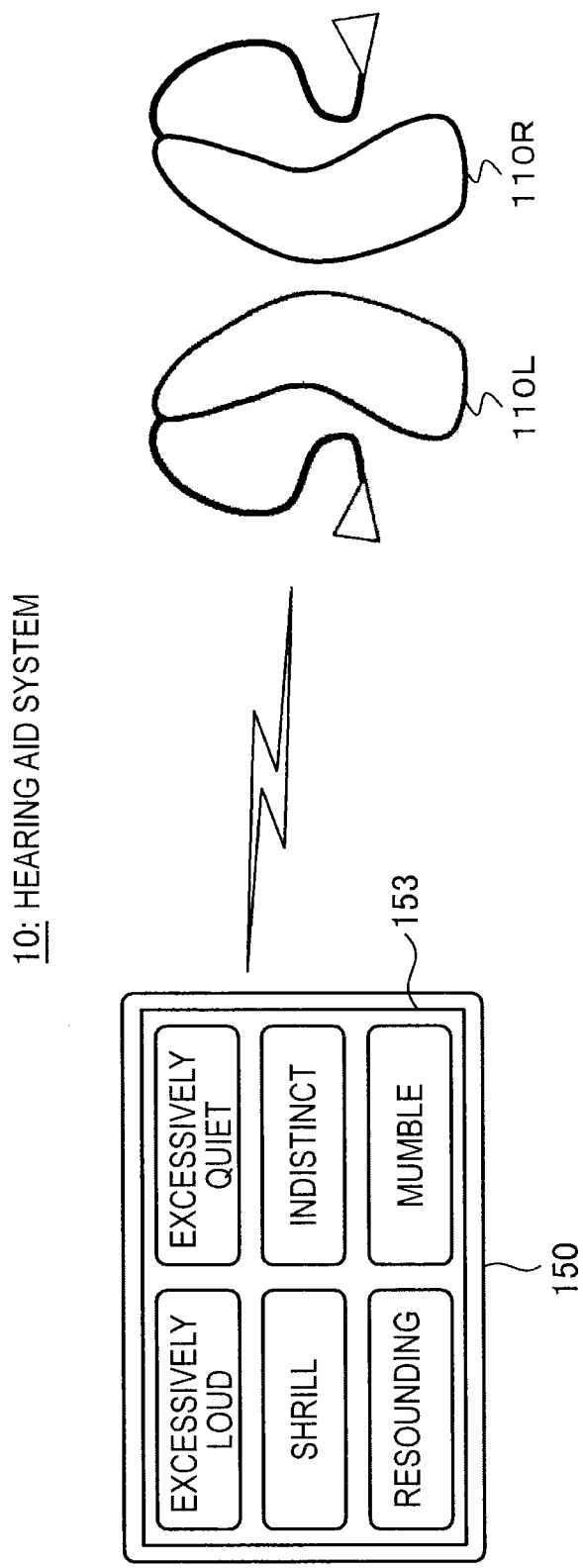
FIG. 1 is a diagram illustrating a configuration example of a hearing aid system according to a first embodiment.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

The following description will be made in the order described below.
1. First Embodiment
2. Second Embodiment
3. Third Embodiment
4. Fourth Embodiment
5. Fifth Embodiment
6. Modification 1. First Embodiment Configuration of Hearing Aid System FIG. 1 illustrates a configuration example of a hearing aid system 10 according to a first embodiment. The hearing aid system 10 includes a pair of hearing aids 110L and 110R and a remote controller 150 to control the hearing aids 110L and 110R.

The hearing aids 110L and 110R and the remote controller 150 can perform mutual communication using wireless communication. The hearing aids 110L and 110R and the remote controller 150 may perform mutual communication using another method, for example, communication based on magnetism or communication in a range in which hearing is disabled. The remote controller 150 may be a remote controller of a button type, a remote controller of a touch panel type in which buttons changes dynamically as will be described below, or another apparatus such as a mobile terminal or a tablet terminal in which a communication mechanism is installed as a program.

The hearing aids 110L and 110R are controlled by the remote controller 150 in a state in which a user wears the hearing aids 110L and 110R. When the user selects an item to be worried about from the impression of a hearing ambient sound, for example, when the user hears a shrill sound while enjoying drama and selects a "shrill" button, information of the selected item is transmitted to the hearing aids 110L and 110R and a sound is adjusted.

Figure 2:
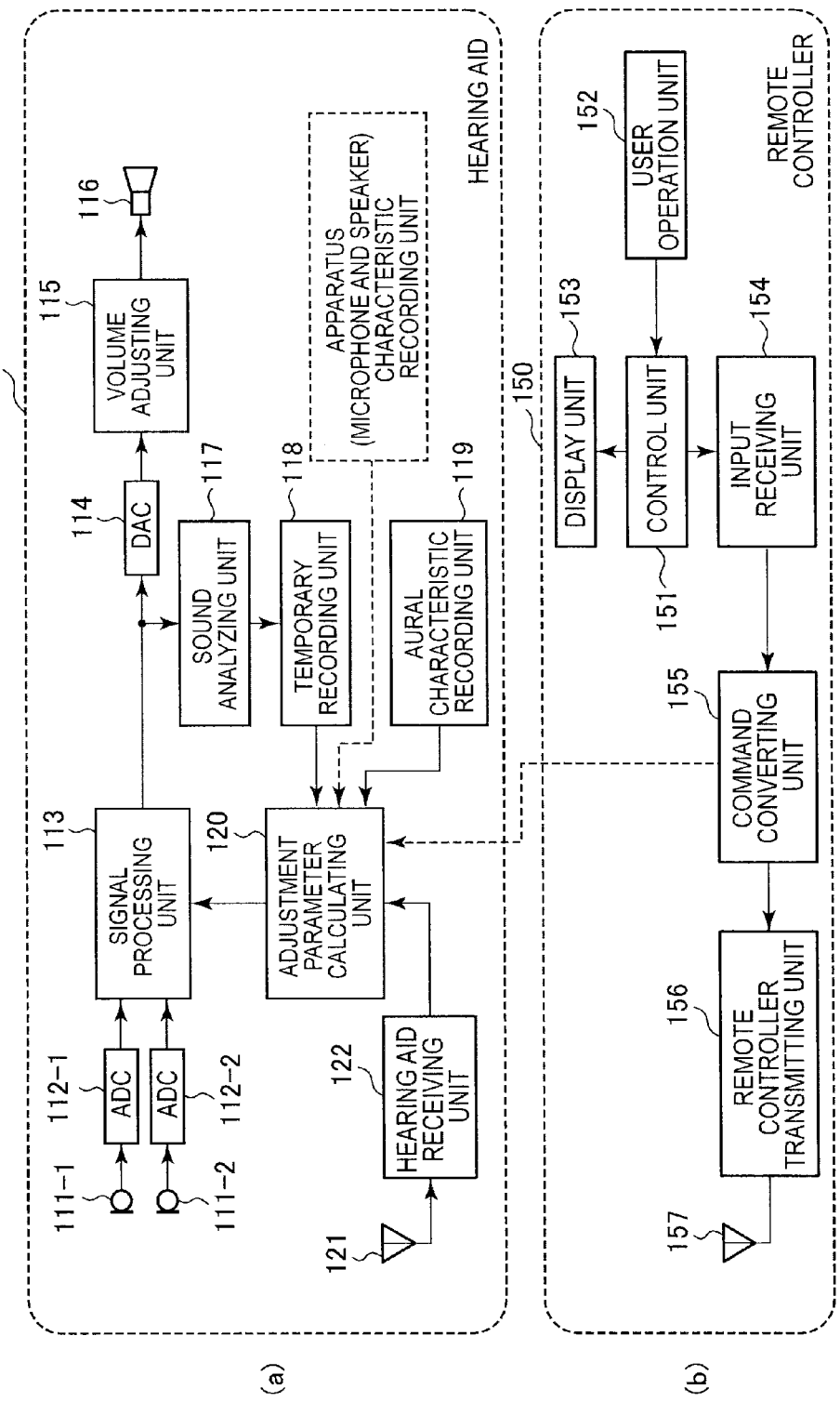
FIGS. 2(a) and 2(b) are block diagrams illustrating a configuration example of a hearing aid and a configuration example of a remote controller, respectively.

FIG. 2(b) illustrates a configuration example of the remote controller 150. The remote controller 150 includes a control unit 151, a user operation unit 152, a display unit 153, an input receiving unit 154, a command converting unit 155, a remote controller transmitting unit 156, and an antenna 157.

The control unit 151 includes a CPU and controls operations of the individual units of the remote controller 150. The user operation unit 152 and the display unit 153 form a user interface. The user operation unit 152 is a unit through which the user performs various operations. For example, the user operation unit 152 is configured using a button or a touch panel. The display unit 153 is configured using a liquid crystal display. On the display unit 153, an operation state is displayed. In addition, when a sound of the hearing aid 110 is adjusted, choices ("excessively loud", "excessively quiet", and "shrill" provided to the remote controller 150 of FIG. 1) that are expressed subjectively and are associated with control with respect to a sound signal are provided (displayed) on the display unit 153.

The input receiving unit 154 receives information of a choice selected by the user, for example, an ID of the selected choice from the control unit 151. The input receiving unit 154 may be integrated with the control unit 151. The command converting unit 155 converts information received by the input receiving unit 154 into a command associated with the information. For example, when the ID of the choice "shrill" is transmitted, the command converting unit 155 converts the ID into a command that means "shrill". The remote controller transmitting unit 156 executes transmission processing with respect to the command converted by the command converting unit 155, generates transmission information including the command, and transmits the transmission information from the antenna 157 to the hearing aid 110 (110L and 110R).

FIG. 2(a) illustrates a configuration example of the hearing aid 110 (110L and 110R). The hearing aid 110 includes microphones 111-1 and 111-2, A/D converters (ADC) 112-1 and 112-2, a signal processing unit 113, a D/A converter (DAC) 114, a volume adjusting unit 115, and a speaker 116. The hearing aid 110 further includes a sound analyzing unit 117, a temporary recording unit 118, an aural characteristic recording unit 119, an adjustment parameter calculating unit 120, an antenna 121, and a hearing aid receiving unit 122.

The microphones 111-1 and 111-2 pick up an ambient sound and obtain a sound signal. In order to simplify explanation, a term "sound signal" is used. However, the sound signal means an acoustic signal including the sound signal in a strict sense. The two microphones 111-1 and 111-2 are included to enable processing for controlling directivity. The number of microphones may be one or may be three or more. The A/D converters 112-1 and 112-2 convert the sound signal obtained by the microphones 111-1 and 111-2 from an analog signal to a digital signal.

The signal processing unit 113 executes various processing with respect to the sound signal (sound signal of a processing object) by the A/D converters 112-1 and 112-2. The signal processing unit 113 executes the following processing generally executed by a recent digital hearing aid and performs adjustment based on an adjustment parameter calculated by the adjustment parameter calculating unit 120 with respect to the sound signal of the processing object.

As the processing that is generally executed by the digital hearing aid, the following processing is executed. For example, auto gain control (AGC) processing for keeping a level of an output sound within a preset range, clipping processing when a level of a digital signal is amplified to a constant level or more, spectrum compression processing for compressing a sound signal of an inaudible frequency band to an audible sound band, spectrum envelope adjustment processing, processing for controlling directivity from plural input signals, noise reduction processing for reducing unnecessary noise, sound emphasis processing for emphasizing a sound, and volume adjustment processing are executed.

The D/A converter 114 converts a sound signal output from the signal processing unit 113 from a digital signal to an analog signal. The volume adjusting unit 115 adjusts the volume of the sound signal obtained by the D/A converter 114 with a set value and outputs the sound signal to the speaker 116.

The sound analyzing unit 117 executes sound analysis processing with respect to the digital sound signal output from the signal processing unit 113 and acquires a feature amount. The feature amount is, for example, pitch information included in a digital sound signal, power of each band after band division processing of a ⅓ octave band and a critical band, a spectrum position (frequency) of maximum power of a power spectrum obtained by performing time-frequency transform such as DFT, or a cepstrum coefficient of the power spectrum. The sound analyzing unit 117 executes calculation processing of the feature amount continuously or intermittently.

The temporary recording unit 118 temporarily records the feature amount acquired by the sound analyzing unit 117, that is, holds the feature amount during a preset period. The temporary recording unit 118 discards data from first recorded data and adds new data, when a recording area is filled, like a queue, and holds the feature amount during a constant period at all times.

The aural characteristic recording unit 119 records an aural characteristic of a user as an individual parameter. The aural characteristic of the user is measured in advance and is recorded in the aural characteristic recording unit 119. The hearing aid receiving unit 122 acquires a command corresponding to a subjective sense transmitted from the remote controller 150, from information received by the antenna 121. The adjustment parameter calculating unit 120 calculates a parameter to adjust a sound signal (hereinafter, referred to as "adjustment parameter") in the signal processing unit 113, on the basis of the command acquired by the hearing aid receiving unit 122, the feature amount of the sound signal of the processing object recorded in the temporary recording unit 118, and the aural characteristic recorded in the aural characteristic recording unit 119.

The adjustment parameter calculating unit 120 calculates the adjustment parameter as follows. For example, when a command corresponding to "shrill" is transmitted, the adjustment parameter calculating unit 120 refers to a time-series record feature amount to acquire maximum power of each band division signal within a record range, takes a difference with aural characteristic information, performs correction calculated from a position where a volume of an equal loudness curve standardized by ISO226:2003 is large, for example, 80 phone, and calculates an adjustment parameter to decrease gain of a band having largest energy.

For example, when a command corresponding to "a sound is inaudible" is transmitted, the adjustment parameter calculating unit 120 predicts a band of the sound from recorded pitch information and calculates an adjustment parameter to decrease gains of the other bands to hear a conversion clearly. When a command corresponding to "keen" is transmitted, the adjustment parameter calculating unit 120 validates howling suppression processing in the case of a frequency which can be processed by the howling suppression processing, from a spectrum position of maximum power of a recorded power spectrum, and decreases gain of a corresponding band and calculates an adjustment parameter to make the sound inaudible, in the case of a frequency which may not be processed by the howling suppression processing.

Next, a normal operation of the hearing aid 110 will be described. An ambient sound is picked up by the microphones 111-1 and 111-2 and an analog sound signal corresponding to the picked-up sound is obtained from the microphones 111-1 and 111-2. The A/D converters 112-1 and 112-2 convert the analog sound signal from an analog signal to a digital signal and supply the digital sound signal to the signal processing unit 113.

In the signal processing unit 113, preset sound signal processing is executed with respect to the digital sound signal. The D/A converter 114 converts the processed digital sound signal output from the signal processing unit 113 from a digital signal to an analog signal and supplies the analog sound signal to the volume adjusting unit 115. In the volume adjusting unit 115, the volume of the analog sound signal is adjusted with a set value. The volume adjusted sound signal is supplied to the speaker 116 and the sound based on the sound signal is output from the speaker 116.

The processed digital sound signal that is output from the signal processing unit 113 is supplied to the sound analyzing unit 117. In the sound analyzing unit 117, sound analysis processing is executed with respect to the digital sound signal, a feature amount of the digital sound signal is acquired, and the acquired feature amount is supplied to the temporary recording unit 118 and is held during a preset period.

In this way, the normal operation of the hearing aid 110 is performed. In the above description, the sound analyzing unit 117 and the temporary recording unit 118 operate at all times. However, the sound analyzing unit 117 and the temporary recording unit 118 may be configured to be operated by an operation of the remote controller to decrease power consumption. In this case, a signal that starts/stops an operation after the sound analyzing unit 117 is transmitted from the hearing aid receiving unit 122, by a system not illustrated in the drawings. For example, when an operation screen is displayed by a remote controller such as a touch panel, the sound analyzing unit 117 and the temporary recording unit 118 may transmit a signal to the hearing aid 110 and the hearing aid 110 may the signal and performs an operation for validating the sound analyzing unit 117 and the temporary recording unit 118, as described above.

Next, an operation in the case in which the user operates the remote controller 150 will be described. In this case, it is assumed that the sound analyzing unit 117 and the temporary recording unit 118 operate at all times, in order to simplify explanation.

When the user desires to adjust hearing, the user selects a subjective sense according to a sense to be worried about from choices provided (displayed) to the display unit 153 of the remote controller 150. In the remote controller 150, information of the choice selected by the user, for example, an ID of the selected choice is received by the input receiving unit 154 and is transmitted to the command converting unit 155.

In the command converting unit 155, the transmitted information is converted into a command associated with the information. For example, when an ID of a choice "shrill" is transmitted, the ID is converted into a command that means "shrill". The command that is obtained by the command converting unit 155 is supplied to the remote controller transmitting unit 156. In the remote controller transmitting unit 156, transmission processing is executed with respect to the command and information including the command is transmitted from the antenna 157 to the hearing aid 110.

In the hearing aid 110, the information that is transmitted from the remote controller 150 is received by the antenna 21 and is supplied to the hearing aid receiving unit 122. In the hearing aid receiving unit 122, the command corresponding to the subjective sense is taken from the received information and is supplied to the adjustment parameter calculating unit 120.

In the adjustment parameter calculating unit 120, if the command is supplied from the remote controller receiving unit 122, an adjustment parameter is calculated. In this case, the signal processing unit 113 calculates an adjustment parameter to adjust the sound signal (sound signal of the processing object), on the basis of the feature amount (hereinafter, referred to as "time-series record feature amount) to be recorded in the temporary recording unit 118 and the aural characteristic information recorded in the aural characteristic recording unit 119. The adjustment parameter is supplied to the signal processing unit 113.

In the signal processing unit 113, when the adjustment parameter is transmitted from the adjustment parameter calculating unit 120, a variety of signal processing is adjusted according to the adjustment parameter. As a result, the sound signal is adjusted. At this time, because a hearing aid signal is also processed, adjustment is made such that corresponding processing is not stopped.

For example, when there is filter processing such as finite impulse response (FIR), it is preferable that a coefficient area be configured as a double buffer, a new coefficient be written to a non-used surface, and the buffer be only replaced at timing at which the processing proceeds to next processing. However, depending on a processing configuration, it may be preferably kept to a mechanism that does not cause abnormal noise.

For example, the signal processing unit 113 is configured to have a first buffer and a second buffer to store the adjustment parameter. When the adjustment parameter is acquired by an acquiring unit in a use state of the adjustment parameter stored in one buffer, the use state is switched into a use state of the adjustment parameter stored in the other buffer after the acquired adjustment parameter is stored in the other buffer. In this case, stopping of adjustment processing with respect to the sound signal can be avoided and a break of the sound can be prevented.

The signal processing unit 113 is configured to have a buffer to store the adjustment parameter. When the adjustment parameter is acquired by the acquiring unit in a use state of the adjustment parameter stored in the buffer, an output of an adjusted acoustic signal is muted and the mute is released after the acquired adjustment parameter is stored in the buffer. In this case, abnormal noise can be prevented from being generated when the adjustment parameter is switched and the user can recognize switching of the adjustment parameter by the break of the sound.

Figure 3:
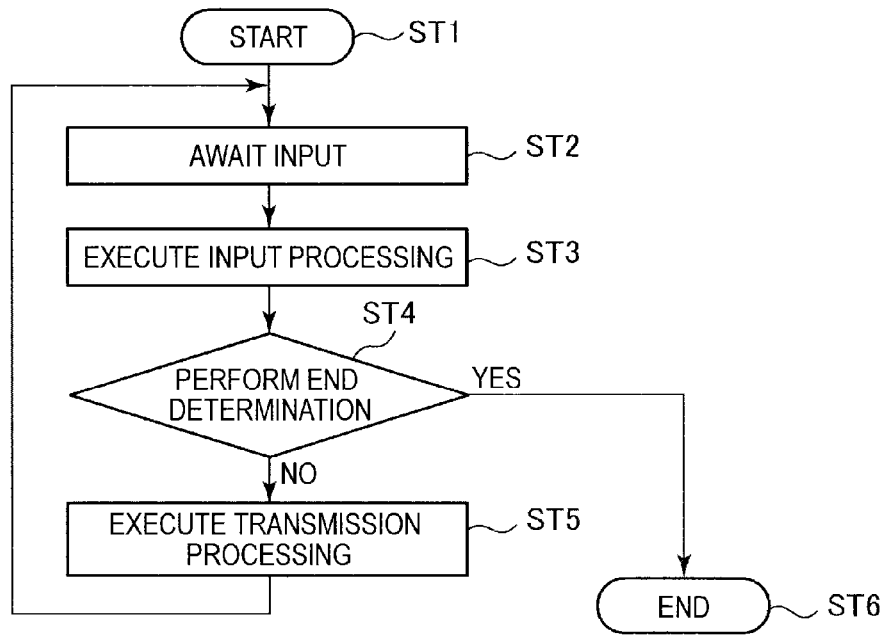
FIG. 3 is a flowchart illustrating a flow of processing of the remote controller.

A flowchart of FIG. 3 illustrates a flow of processing of the remote controller 150. The remote controller 150 executes the processing periodically or according to an explicit instruction from the user. In step ST1, the remote controller 150 starts the processing. In step ST2, the remote controller 150 awaits an input. If there is the input, the remote controller makes the processing proceed to input processing of step ST3. In the input processing, the remote controller 150 determines whether to end the processing or transmit a parameter, according to an input key. When it is determined that the parameter is transmitted, the remote controller 150 generates the parameter and makes the processing proceed to processing of step ST4.

In step ST4, the remote controller 150 performs an end determination. In the end determination, when there is an input showing the end, the remote controller 150 makes the processing proceed to step ST6, turns off a power supply of the remote controller, and ends the processing immediately.

When there is a parameter to be transmitted, the remote controller 150 makes the processing proceed to processing of step ST5. In step ST5, the remote controller 150 executes transmission processing for transmitting a parameter. Then, the remote controller 150 returns the processing to step ST2 and awaits an input.

Figure 4:
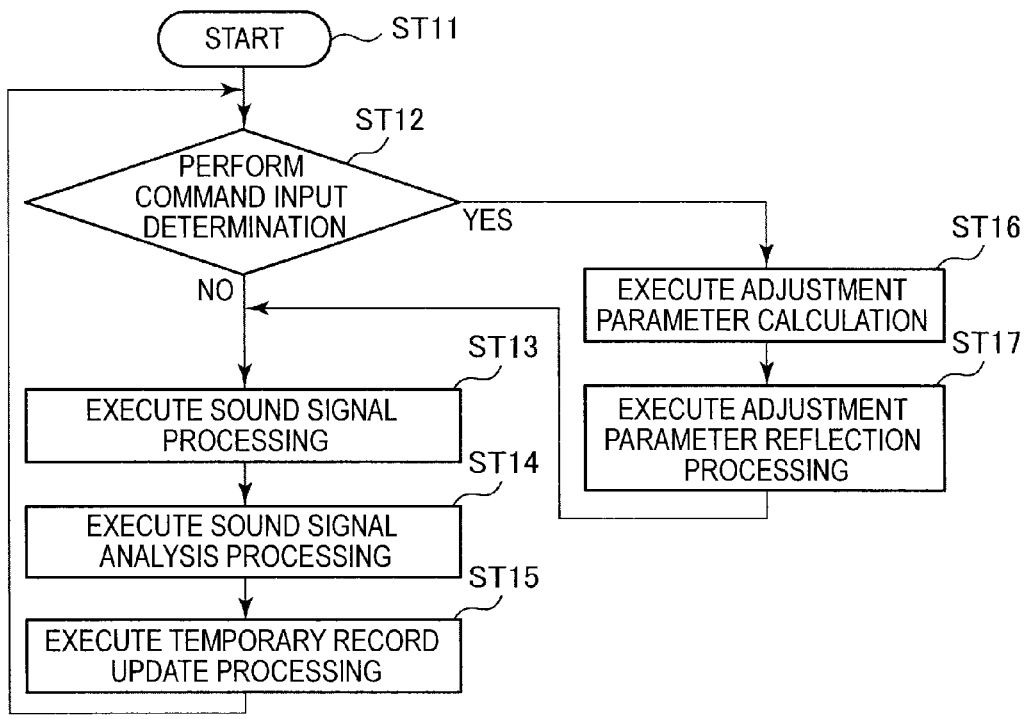
FIG. 4 is a flowchart illustrating a flow of processing of the hearing aid.

A flowchart of FIG. 4 illustrates a flow of the processing of the hearing aid 110. The hearing aid 110 executes the processing periodically or according to an explicit instruction from the user. In step ST11, the hearing aid 110 starts the processing. In step ST12, the hearing aid 110 performs a command input determination. If there is no command input, the hearing aid 110 makes the processing proceed to sound signal processing of step ST13. In the sound signal processing, the hearing aid 110 executes the sound signal processing for improving hearing and outputs the sound signal to the speaker, by a system not illustrated in the drawings.

Next, the hearing aid 110 makes the processing proceed to sound signal analysis processing of step ST14. In the sound signal analysis processing, the hearing aid 110 executes the sound signal analysis processing to calculate the feature amount used in the adjustment parameter calculation processing. After executing the processing of step ST14, the hearing aid 110 makes the processing proceed to temporary record update processing of step ST15. In the temporary record update processing, the hearing aid 110 forms a ring buffer, when there is no available area in the temporary recording unit 118, to record the calculated feature amount, overwrites the calculated feature amount to an area where the oldest feature amount is recorded, and executes the processing such that the feature amount of the constant period is recorded. After the processing of step ST15, the hearing aid 150 returns the processing to step ST12 and performs the command input determination.

When it is determined in step ST12 that there is the command input, the hearing aid 110 makes the processing proceed to the adjustment parameter calculation processing of step ST16. In the adjustment parameter calculation processing, the hearing aid 110 refers to the recorded feature amount of the constant period and the aural characteristic information, performs analysis according to the transmitted command, and calculates a parameter for signal processing adjustment.

The hearing aid 110 makes the processing proceed to adjustment parameter reflection processing of step ST17. In the adjustment parameter reflection processing, the hearing aid 110 adjusts a coefficient or AGC setting of signal processing in which adjustment is necessary, for example, filter processing and completely clears the recorded feature amount of the constant period. After the processing of step ST17, the hearing aid 110 makes the processing proceed to the sound signal processing of step ST13.

In the above description, in the adjustment parameter reflection processing of step ST17, the hearing aid 110 completely clears the feature amount of the constant period that is recorded in the temporary recording unit 118. However, the hearing aid 110 may not completely clear the feature amount. For example, when the storage capacity of the temporary recording unit 118 is large, the hearing aid 110 can continuously perform new recording without clearing.

As described above, in the hearing aid system 10 illustrated in FIG. 1, the user can select a predetermined choice corresponding to subjectivity with respect to a hearing sound, from the choices provided to the display unit of the remote controller 150 and expressed subjectively. Information of the selected predetermined choice is transmitted to the hearing aid 110. In the hearing aid 110, processing for adjusting the volume and the sound quality of the sound signal on the basis of the predetermined choice is executed. Therefore, the user can adjust the sound (the volume and the sound quality) in the hearing aid 110 with a subjective sense with respect to the sound. Even if the user does not have detailed knowledge for a sound, the user can perform desired adjustment.

Figure 5:
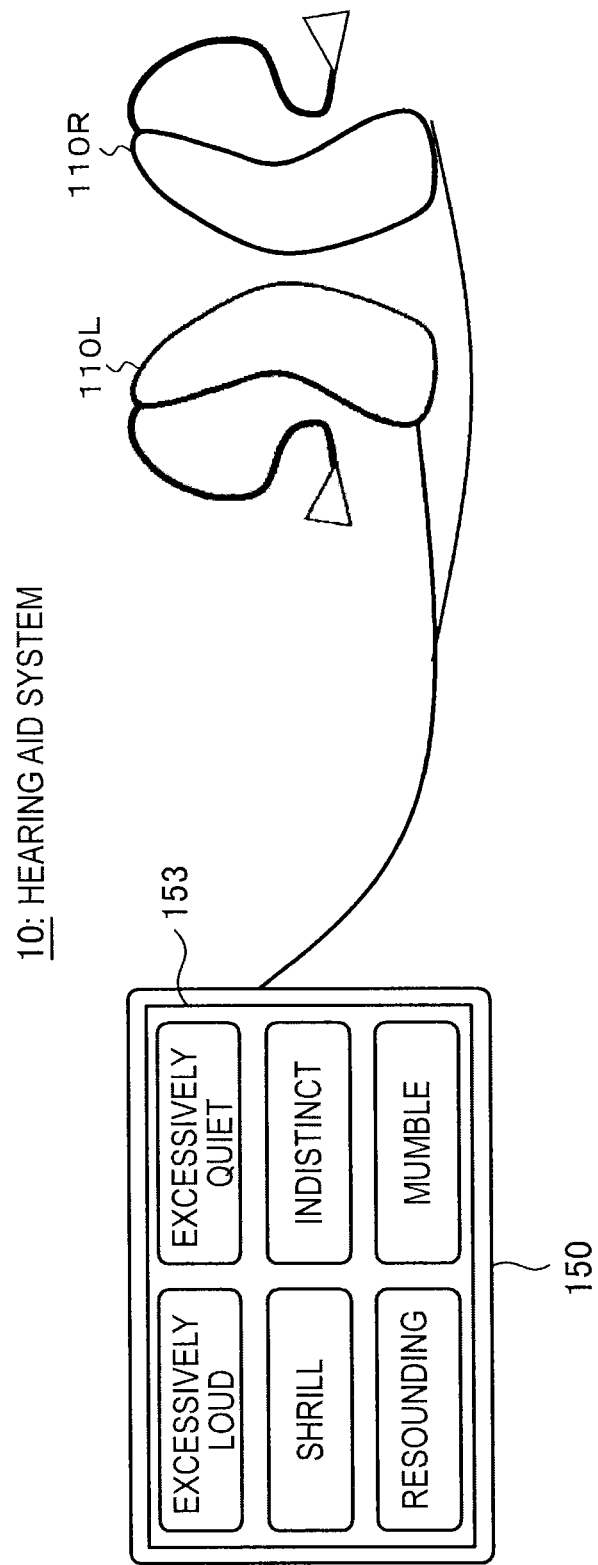
FIG. 5 is a diagram illustrating another configuration example of the hearing aid system.

In the above description, the hearing aids 110L and 110R and the remote controller 150 perform wireless communication. As illustrated in FIG. 5, the hearing aids 110L and 110R and the remote controller 150 may perform wired communication. In this case, as illustrated by a broken line in FIGS. 2(a) and 2(b), a command is supplied directly from the command converting unit 155 of the remote controller 150 to the adjustment parameter calculating unit 120 of the hearing aid 110. At this time, the remote controller transmitting unit 156 and the antenna 157 of the remote controller 150 and the antenna 121 and the hearing aid receiving unit 122 of the hearing aid 110 become unnecessary.

Although not described in detail above, a display aspect of the choice that is provided (displayed) to the display unit 152 of the remote controller 150 may be dynamically changed according to the selected choice or the feature amount of the sound signal of the processing object. By the dynamic change of the display aspect, the user can perform the sound adjustment based on the selection of the choice appropriately and efficiently. Hereinafter, an example of the dynamic change of the display aspect will be described.

Figure 6:
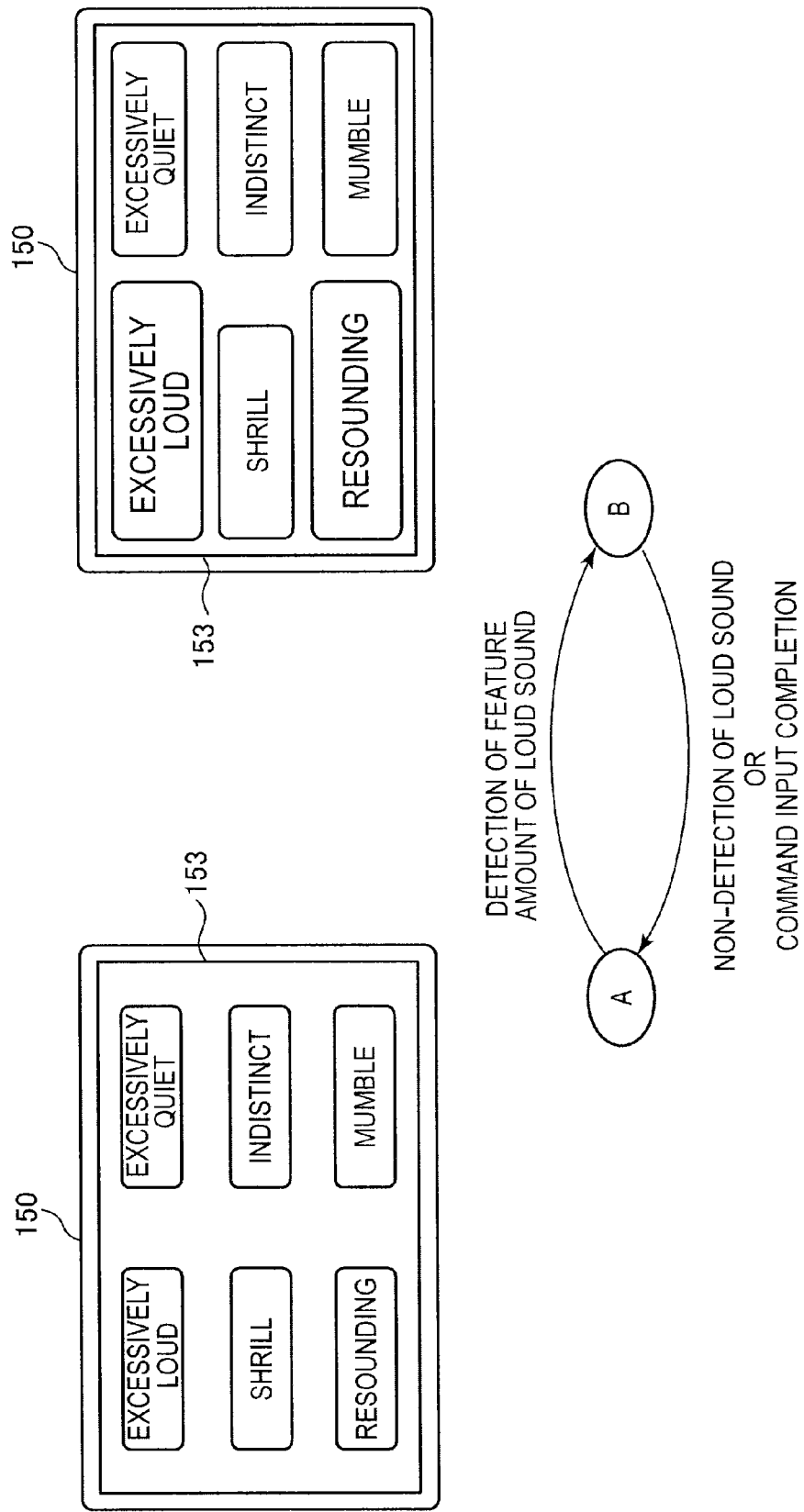
FIG. 6 is a diagram illustrating an example of the case in which sizes of characters of choices provided (displayed) to a display unit of the remote controller change according to a feature amount of a sound signal of a processing object in the hearing aid.

FIG. 6 illustrates an example of the case in which sizes of characters of choices provided (displayed) to a display unit 153 of the remote controller 150 change according to a feature amount of a sound signal of a processing object in the hearing aid 110. In this case, it is necessary to supply the feature amount obtained by the sound analyzing unit 117 from the hearing aid 110 to the remote controller 150 by wire or wireless. In this example, in a display aspect of "A", when a feature amount of a loud sound is detected, "excessively loud" is emphasized and displayed big and associated "ring" is emphasized and displayed slightly big, like a display aspect of "B". In this example, sizes of the other choices are not changed. However, the sizes of the other choices may be changed to decrease. For example, even when the feature amount of the loud sound is not detected or selection of the choice is completed, that is, a command input is completed, the display aspect returns from the display aspect of "B" to the display aspect of "A".

Figure 7:
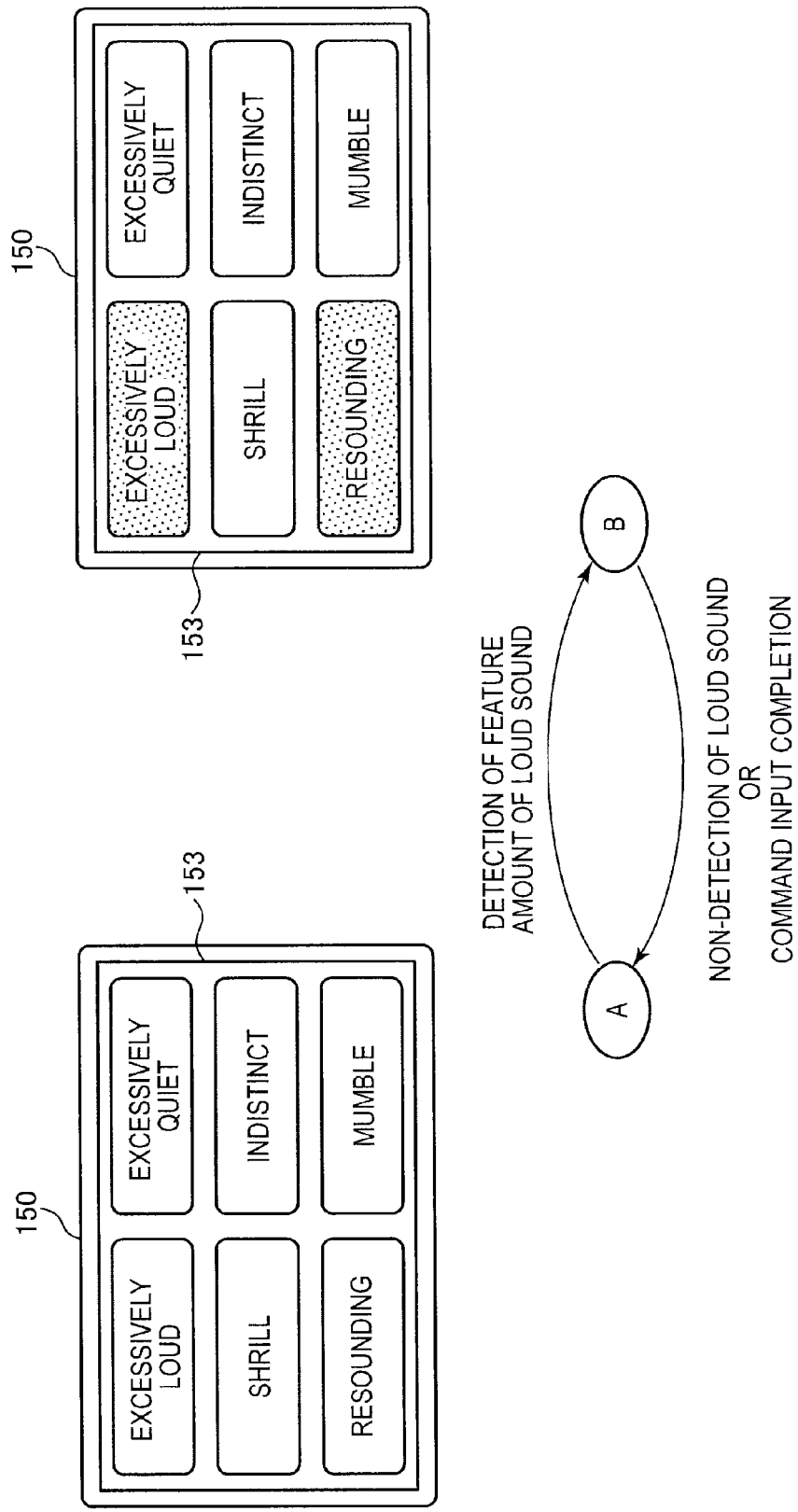
FIG. 7 is a diagram illustrating an example of the case in which display colors of the choices provided (displayed) to the display unit of the remote controller change according to a feature amount of a sound signal of a processing object in the hearing aid.

FIG. 7 illustrates an example of the case in which display colors of choices provided (displayed) to a display unit 153 of the remote controller 150 change according to a feature amount of a sound signal of a processing object in the hearing aid 110. In this example, in a display aspect of "A", when a feature amount of a loud sound is detected, a display color of "excessively loud" is changed to a color that distinguishes from colors of the other choices and a display color of associated "ring" is also changed to a color that distinguishes from the colors of the other choices, like a display aspect of "B". In this example, the colors of the other choices are not changed. However, the display colors of the other choices may be lightened and changed. For example, when the feature amount of the loud sound is not detected or selection of the choice is completed, that is, a command input is completed, the display aspect returns from the display aspect of "B" to the display aspect of "A".

The sizes or the colors of the display items are changed according to the feature amount of the sound signal of the processing object in the hearing aid 110, as described above.

In addition, in a normal state, "loud", "noisy", "shrill", and "ring" may be displayed. When a level of an input sound decreases, the display items may be changed to "indistinct", "quiet", and "unclear".

Figure 8:
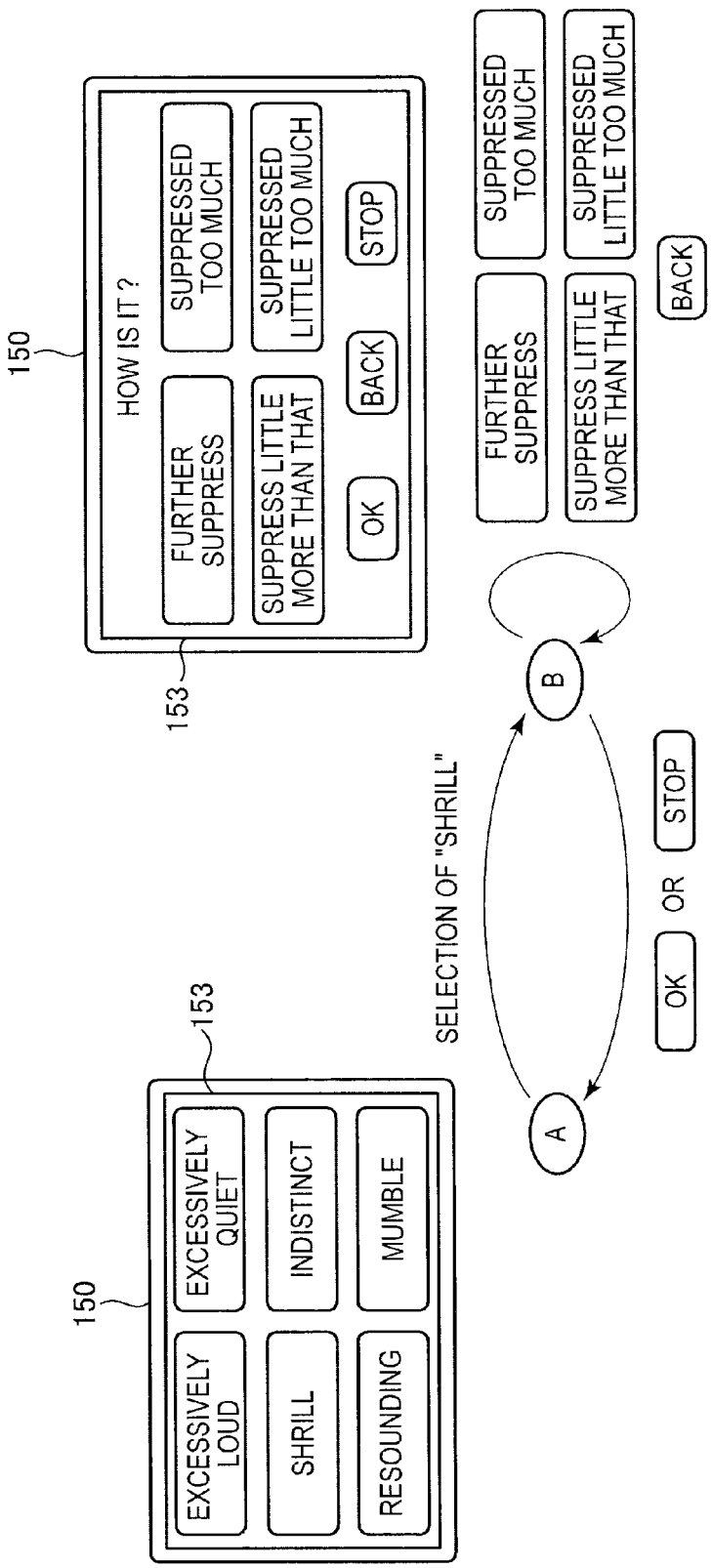
FIG. 8 is a diagram illustrating an example of the case in which the choices provided (displayed) to the display unit of the remote controller change according to a selected choice.

FIG. 8 illustrates an example of the case in which choices provided (displayed) to a display unit 153 of the remote controller 150 change according to a selected choice. In this example, in a display aspect of "A", when "shrill" is selected, choices that are useful for new adjustment with respect to adjustment of "shrill", for example, "further suppress" and "suppressed little too much" are displayed, like a display aspect of "B". "Back" is a button to cancel immediately previous adjustment and "stop" is a button to completely cancel this-time adjustment. "How is it" can be provided in a form of a sound. For example, when "OK" button or "STOP" button is operated, the display aspect returns from the display aspect of "B" to the display aspect of "A".

Figure 9:
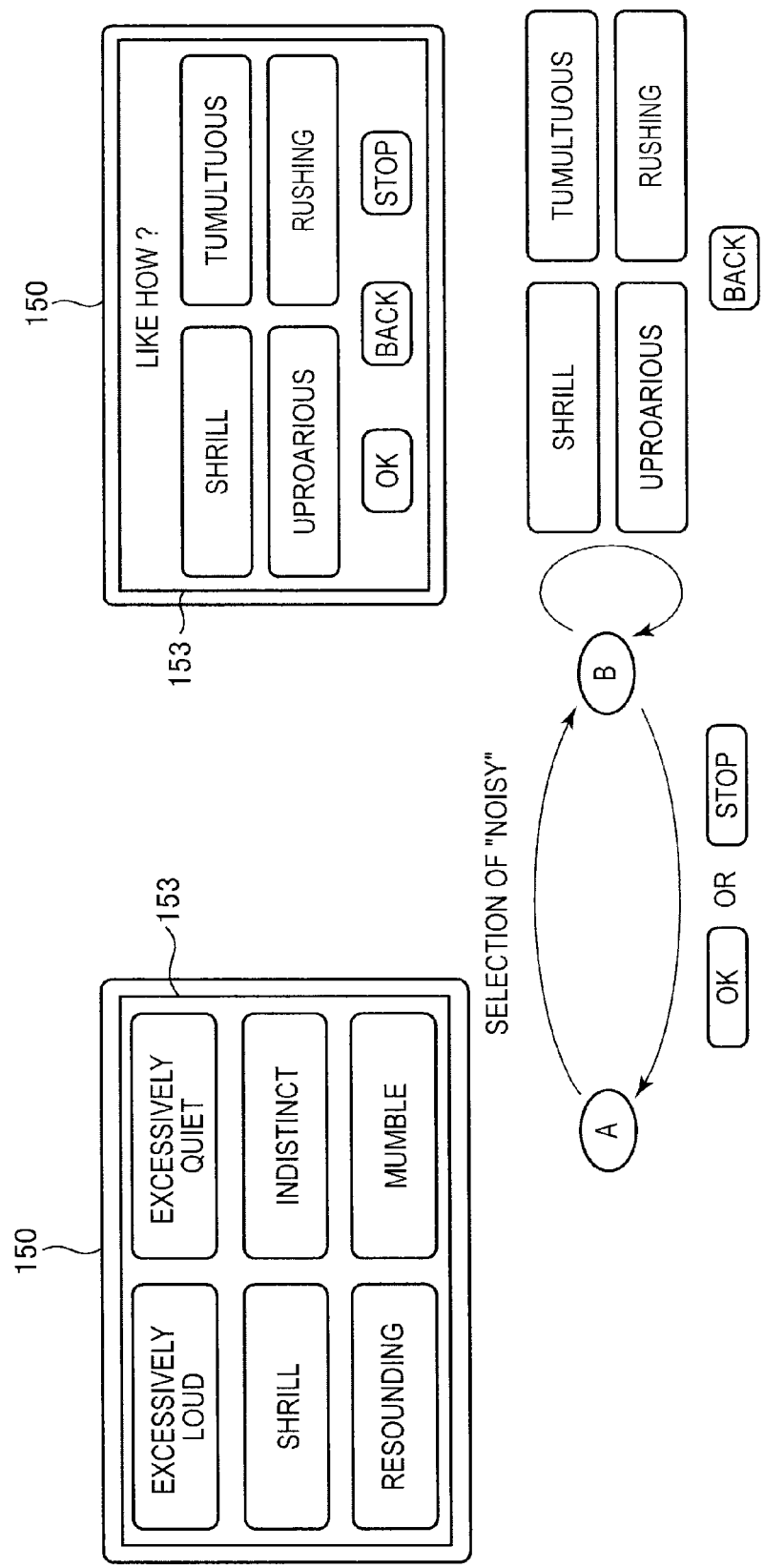
FIG. 9 is a diagram illustrating an example of the case in which the choices provided (displayed) to the display unit of the remote controller change according to a selected choice.

FIG. 9 illustrates an example of the case in which choices provided (displayed) to a display unit 153 of the remote controller 150 change according to a selected choice. In this example, in a display aspect of "A", when "noisy" is selected, choices that correspond to subjective expressions of a lower hierarchy with respect to adjustment of "noisy", for example, "shrill" and "tumultuous" are displayed, like a display aspect of "B". "Back" is a button to cancel immediately previous adjustment and "stop" is a button to completely cancel this-time adjustment. "How is it" can be provided in a form of a sound. For example, when "OK" button or "STOP" button is operated, the display aspect returns from the display aspect of "B" to the display aspect of "A".

Figure 10:
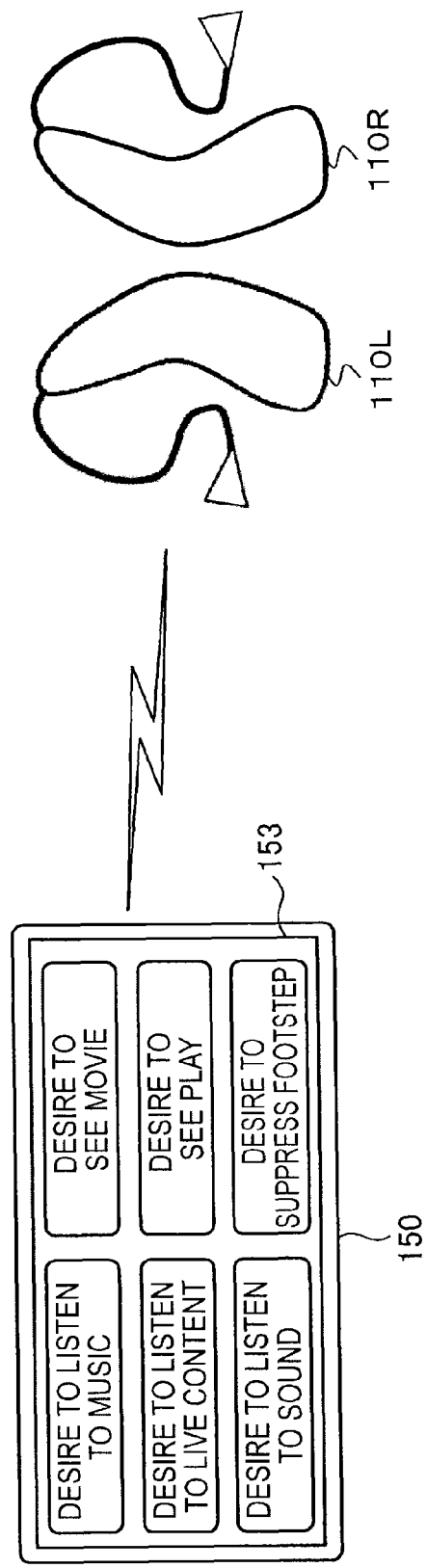
FIG. 10 is a diagram illustrating an example of the case in which subjective expressions of the choices provided (displayed) to the display unit of the remote controller are subjective requests.

In the above description, the subjective expressions of the choices that are provided (displayed) to the display unit 153 of the remote controller 150 are the expressions that show the subjective senses such as "excessively loud" and "noise". However, the expressions of the choices may be expressions that show subjective requests such as "desire to listen to music" and "desire to see a movie", as illustrated in FIG. 10.

FIG. 11 illustrates an example of subjective expressions with respect to a sound that can become expressions of a subjective sense and a subjective request.

In the above description, in the adjustment parameter calculating unit 120 of the hearing aid 110, the aural characteristic of the user that is recorded as the individual parameter in the aural characteristic recording unit 119 is added and the adjustment parameter that corresponds to the command is calculated. However, the individual parameter is not limited to the aural characteristic. For example, the characteristics of the microphones 111-1 and 111-2 and the characteristic of the speaker 116 may be added or may be used independently. In this case, as illustrated by a broken line in FIGS. 2(a) and 2(b), the characteristics of the microphones and the speaker are measured in advance and are recorded in a recording unit.

In the above description, in the remote controller 150, the choices are displayed on the display unit 152 to provide the choices to the user, that is, visually provide the choices to the user. However, the choices may be provided in a form of a sound output from a speaker not illustrated in the drawings, that is, may be aurally provided.

In the above description, the hearing aid 110 executes the analysis processing of the sound signal of the processing object and the calculation processing of the adjustment parameter. However, the remote controller 150 may execute the analysis processing or the calculation processing or execute both the analysis processing and the calculation processing to decrease the processing load of the hearing aid 110 and decrease the consumption power.

Figure 12:
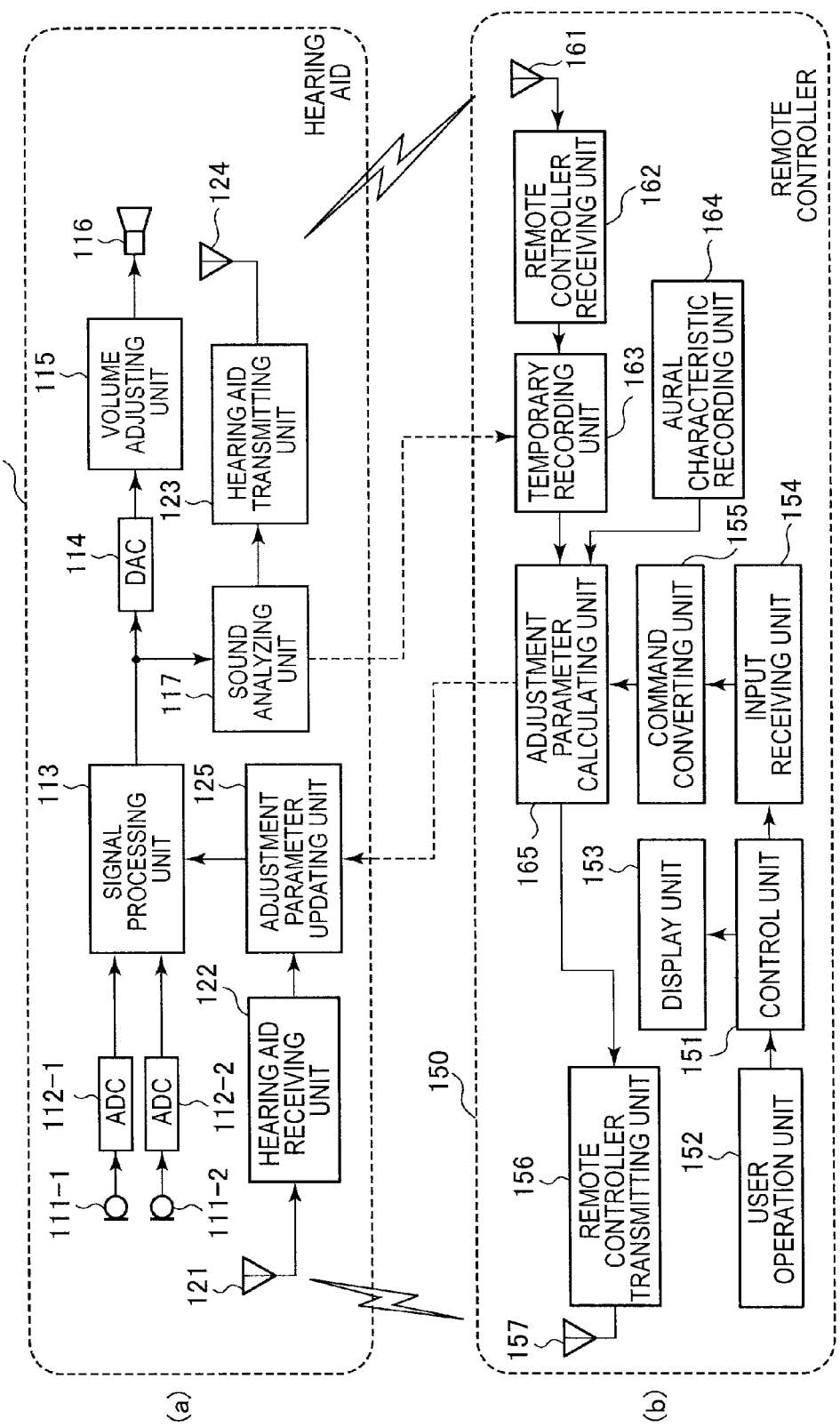
FIGS. 12(a) and 12(b) are block diagrams illustrating another configuration example of the hearing aid and another configuration example of the remote controller, respectively.

FIGS. 12(a) and 12(b) illustrate configuration examples of the hearing aid 110 and the remote controller 150 in the case in which the calculation processing of the adjustment parameter is executed by the remote controller 150. In FIGS. 12(a) and 12(b), structural elements that correspond to those of FIGS. 2(a) and 2(b) are denoted by the same reference numerals and detailed explanation thereof is appropriately omitted.

FIG. 12(b) illustrates the configuration example of the remote controller 150. The remote controller 150 includes a control unit 151, a user operation unit 152, a display unit 153, an input receiving unit 154, a command converting unit 155, a remote controller transmitting unit 156, and an antenna 157. The remote controller 150 further includes an antenna 161, a remote controller receiving unit 162, a temporary recording unit 163, an aural characteristic recording unit 164, and an adjustment parameter calculating unit 165.

From information including a feature amount of a sound signal of a processing object that is received by the antenna 161 and is transmitted from the hearing aid 110, the remote controller receiving unit 162 acquires the feature amount. Similar to the temporary recording unit 118 illustrated in FIG. 2(a), the temporary recording unit 163 temporarily records the feature amount that is acquired by the sound analyzing unit 117, that is, holds the feature amount during a preset period. When there are hearing aids 110L and 110R as the hearing aid 110, the temporary recording unit 163 records each feature amount in a different area. Similar to the aural characteristic recording unit 119 illustrated in FIG. 2(a), the aural characteristic recording unit 164 records an aural characteristic of the user as an individual parameter.

Similar to the adjustment parameter calculating unit 120 illustrated in FIG. 2(a), the adjustment parameter calculating unit 165 calculates an adjustment parameter, on the basis of the command obtained by the command converting unit 155, the feature amount of the sound signal of the processing object recorded in the temporary recording unit 163, and the aural characteristic recorded in the aural characteristic recording unit 164. When there are both the hearing aids 110L and 110R as the hearing aid 110, the adjustment parameter calculating unit 165 individually calculates an adjustment parameter with respect to each hearing aid, using each feature amount.

The remote controller transmitting unit 156 executes transmission processing with respect to the adjustment parameter calculated by the adjustment parameter calculating unit 165, generates transmission information including the adjustment parameter, and transmits the transmission information from the antenna 157 to the hearing aid 110. When there are both the hearing aids 110L and 110R as the hearing aid 110, the remote controller transmitting unit 156 individually transmits the adjustment parameter with respect to each hearing aid to each hearing aid. The other configuration of the remote controller 150 is the same as that of the remote controller 150 illustrated in FIG. 2(b).

FIG. 12(a) illustrates the configuration example of the hearing aid 110 (110L and 110R). The hearing aid 110 includes microphones 111-1 and 111-2, A/D converters (ADC) 112-1 and 112-2, a signal processing unit 113, a D/A converter (DAC) 114, a volume adjusting unit 115, and a speaker 116. The hearing aid 110 further includes a sound analyzing unit 117, a hearing aid transmitting unit 123, an antenna 124, an antenna 121, a hearing aid receiving unit 122, and an adjustment parameter updating unit 125.

The hearing aid transmitting unit 123 executes transmission processing with respect to the feature amount acquired by the sound analyzing unit 117, generates transmission information including the feature amount, and transmits the transmission information from the antenna 124 to the remote controller 150. The hearing aid receiving unit 122 acquires the adjustment parameter transmitted from the remote controller 150, from the information received by the antenna 121. The adjustment parameter updating unit 125 sets the adjustment parameter acquired by the hearing aid receiving unit 122 to the signal processing unit 113. The other configuration of the hearing aid 110 is the same as that of the hearing aid 110 illustrated in FIG. 2(a).

Next, a normal operation of the hearing aid 110 will be described. An ambient sound is picked up by the microphones 111-1 and 111-2 and an analog sound signal corresponding to the picked-up sound is obtained from the microphones 111-1 and 111-2. The A/D converters 112-1 and 112-2 convert the analog sound signal from an analog signal to a digital signal and supply the digital sound signal to the signal processing unit 113.

In the signal processing unit 113, preset sound signal processing is executed with respect to the digital sound signal. The D/A converter 114 converts the processed digital sound signal output from the signal processing unit 113 from a digital signal to an analog signal and supplies the analog sound signal to the volume adjusting unit 115. In the volume adjusting unit 115, the volume of the analog sound signal is adjusted with a set value. The volume adjusted sound signal is supplied to the speaker 116 and the sound based on the sound signal is output from the speaker 116.

The processed digital sound signal that is output from the signal processing unit 113 is supplied to the sound analyzing unit 117. In the sound analyzing unit 117, sound analysis processing is executed with respect to the digital sound signal and a feature amount of the digital sound signal is acquired. The feature amount is supplied to the hearing aid transmitting unit 123. In the hearing aid transmitting unit 123, transmission processing is executed with respect to the feature amount and information including the feature amount is transmitted from the antenna 124 to the remote controller 150.

In the remote controller 150, the information that is transmitted from the hearing aid 110 is received by the antenna 161 and is supplied to the remote controller receiving unit 162. In the remote controller receiving unit 162, the feature amount of the sound signal of the processing object in the hearing aid 110 is taken from the received information, is supplied to the temporary recording unit 118, and is held during a preset period.

Next, an operation in the case in which the user operates the remote controller 150 will be described. When the user desires to adjust hearing, the user selects the subjective sense according to the sense to be worried about from choices provided (displayed) to the display unit 153 of the remote controller 150. In the remote controller 150, information of the choice selected by the user, for example, an ID of the selected choice is received by the input receiving unit 154 and is transmitted to the command converting unit 155.

In the command converting unit 155, the transmitted information is converted into a command associated with the information and is supplied to the adjustment parameter calculating unit 165. In the adjustment parameter calculating unit 165, if the command is supplied from the command converting unit 155, the adjustment parameter is calculated.

In this case, the adjustment parameter is calculated on the basis of the feature amount recorded in the temporary recording unit 163 and the aural characteristic information recorded in the aural characteristic recording unit 164. The adjustment parameter is supplied to the remote controller transmitting unit 156. In the remote controller transmitting unit 156, transmission processing is executed with respect to the adjustment parameter and information including the adjustment parameter is transmitted from the antenna 157 to the hearing aid 110.

In the hearing aid 110, the information that is transmitted from the remote controller 150 is received by the antenna 21 and is supplied to the hearing aid receiving unit 122. In the hearing aid receiving unit 122, the adjustment parameter is taken from the received information and is supplied to the adjustment parameter updating unit 125 and the adjustment parameter in the signal processing unit 113 is updated. In the signal processing unit 113, a variety of signal processing is adjusted according to the adjustment parameter. As a result, the sound signal is effectively adjusted.

Figure 13:
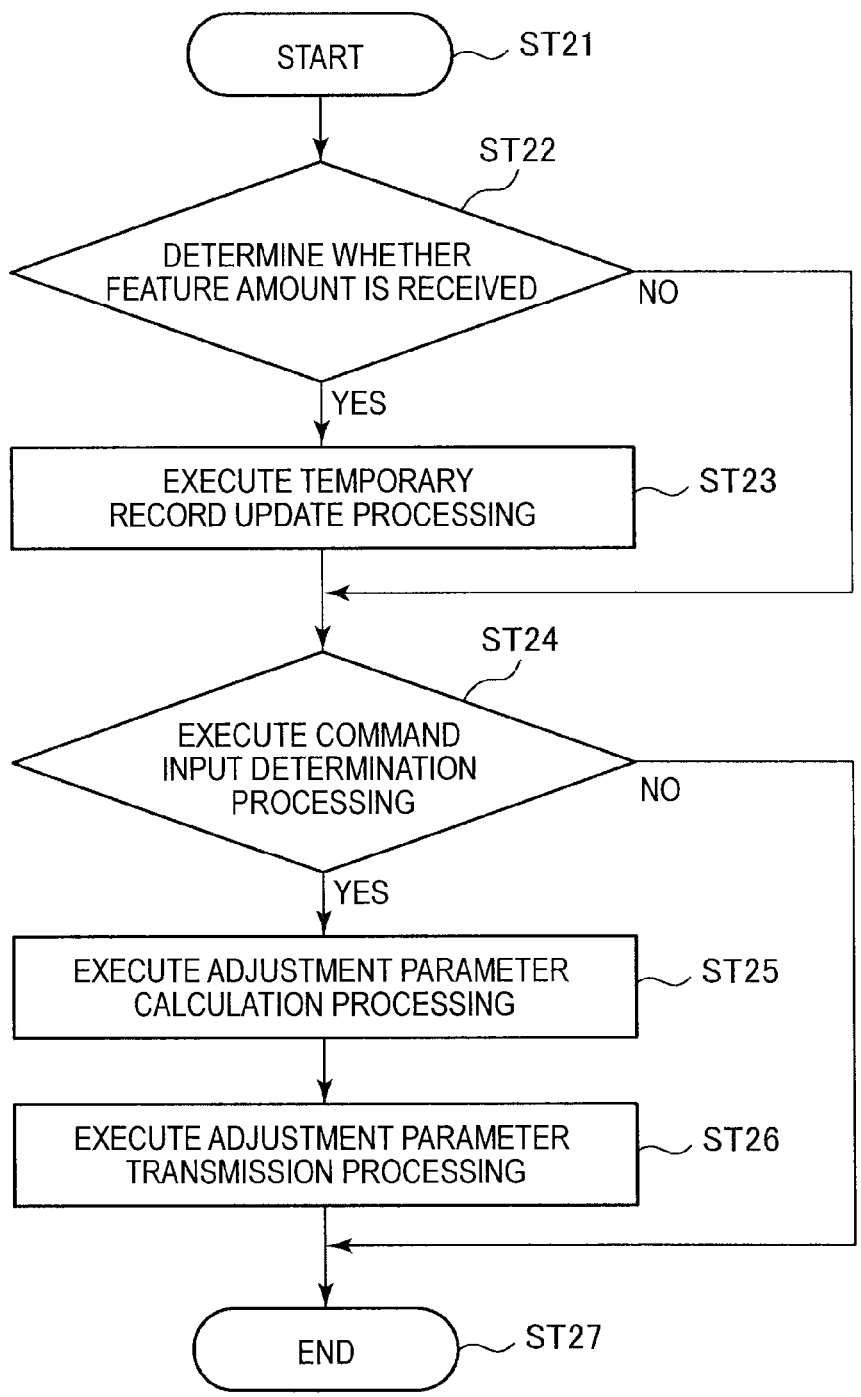
FIG. 13 is a flowchart illustrating a flow of processing of the remote controller.

A flowchart of FIG. 13 illustrates a flow of processing of the remote controller 150. The remote controller 150 executes the processing periodically or according to an explicit instruction from the user. In step ST21, the remote controller 150 starts the processing. In step ST22, the remote controller 150 determines whether the feature amount is received from the hearing aid 110. When the feature amount is received, in step ST23, the remote controller 150 executes temporary record update processing. In the temporary record update processing, the remote controller 150 holds the received feature amount in the temporary recording unit 163.

Next, the remote controller 150 makes the processing proceed to command input determination processing of step ST24. When it is determined in step ST22 that the feature amount is not received, the remote controller 150 makes the processing proceed to processing of step ST24 immediately. In the command input determination processing, the remote controller 150 determines whether there is a command, that is, a request for adjustment of a sound (the volume and the sound quality) from the user. When there is the request, the remote controller 150 makes the processing proceed to adjustment parameter calculation processing of step ST25. In the adjustment parameter calculation processing, the remote controller 150 refers the recorded feature amount of the constant period and the aural characteristic information, performs analysis according to the command, and calculates a parameter for signal processing adjustment.

Next, the remote controller 150 makes the processing proceed to adjustment parameter transmission processing of step ST26. In the adjustment parameter transmission processing, the remote controller 150 transmits the adjustment parameter calculated in step ST25 to the hearing aid 110. In this case, an adjustment parameter sequence may be transmitted as it is. However, information compression based on a predetermined communication method may be performed and information may be transmitted. After processing of step ST26, in step ST27, the remote controller 150 ends the processing.

Figure 14:
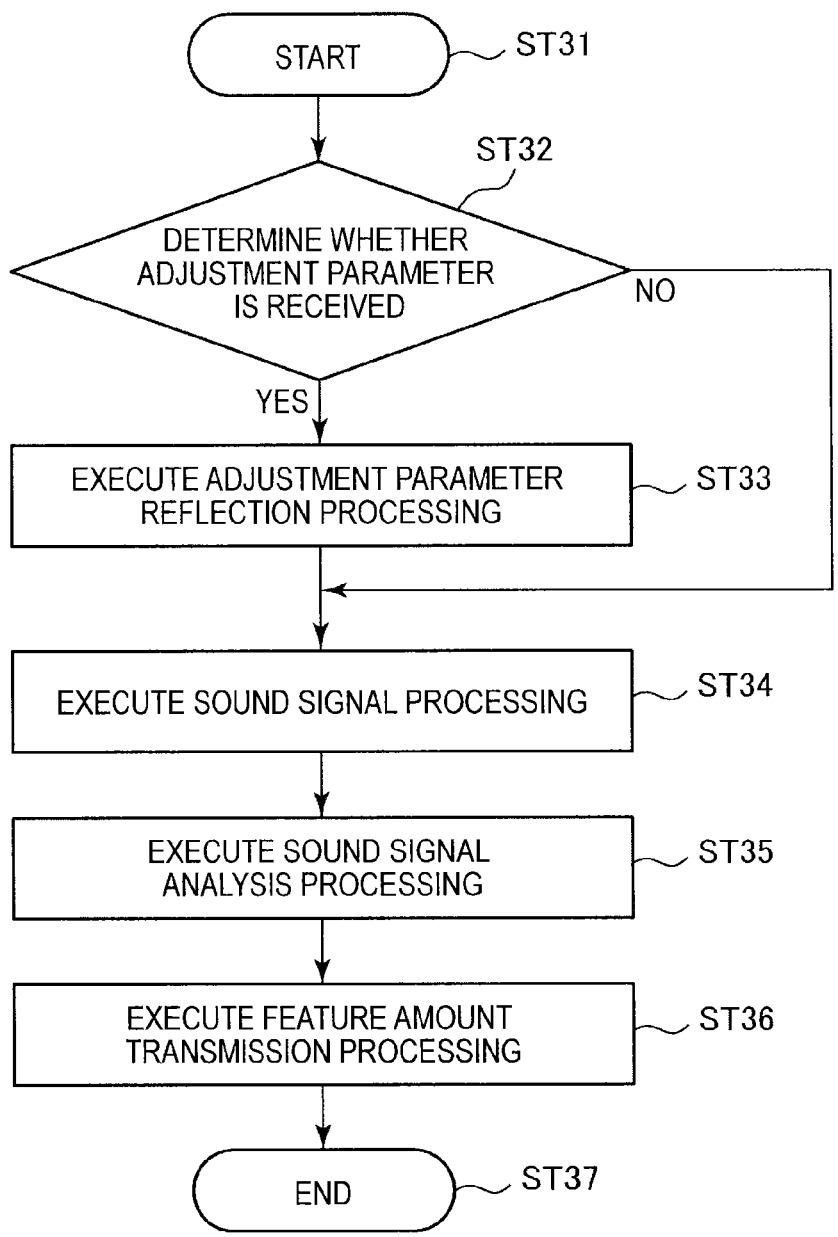
FIG. 14 is a flowchart illustrating a flow of processing of the hearing aid.

A flowchart of FIG. 14 illustrates a flow of the processing of the hearing aid 110. The hearing aid 110 executes the processing periodically or according to an explicit instruction from the user. In step ST31, the hearing aid 110 starts the processing. In step ST32, the hearing aid 110 determines whether the adjustment parameter is received. When the adjustment parameter is received, the hearing aid 110 makes the processing proceed to adjustment parameter reflection processing of step ST33. In the adjustment parameter reflection processing, the hearing aid 110 performs setting of the received adjustment parameter, for example, coefficient setting of filter processing or setting of AGC to the signal processing unit 113.

Next, the hearing aid 110 makes the processing proceed to sound signal processing of step ST34. When it is determined in step ST32 that the adjustment parameter is not received, the hearing aid 110 makes the processing proceed to processing of step ST34 immediately. In the sound signal processing, the hearing aid 110 executes the sound signal processing to improve hearing and outputs the sound signal to the speaker, by a system not illustrated in the drawings.

Next, the hearing aid 110 makes the processing proceed to sound signal analysis processing of step ST35. In the sound signal analysis processing, the hearing aid 110 executes the sound signal analysis processing to calculate the feature amount used in the adjustment parameter calculation processing. After executing the processing of step ST35, the hearing aid 110 makes the processing proceed to feature amount transmission processing of step ST36. In the feature amount transmission processing, the hearing aid 110 transmits the feature amount calculated in step ST35 to the remote controller 150. In this case, a feature sequence may be transmitted as it is. However, information compression based on a predetermined communication method may be performed and information may be transmitted. After processing of step ST36, in step ST37, the hearing aid 110 ends the processing.

In the above description, the hearing aids 110L and 110R and the remote controller 150 perform wireless communication. However, the hearing aids 110L and 110R and the remote controller 150 may perform wired communication. In this case, as illustrated by a broken line in FIGS. 12(a) and 12(b), the feature amount is supplied directly from the sound analyzing unit 117 of the hearing aid 110 to the temporary recording unit 163 of the remote controller 150 and the adjustment parameter is supplied directly from the adjustment parameter calculating unit 165 of the remote controller 150 the adjustment parameter updating unit 125 of the hearing aid 110. In this case, in the remote controller 150, the antenna 161, the remote controller receiving unit 162, the remote controller transmitting unit 156, and the antenna 157 become unnecessary. In the hearing aid 110, the antenna 121, the hearing aid receiving unit 122, the hearing aid transmitting unit 123, and the antenna 124 become unnecessary.

In the configuration illustrated in FIGS. 12(a) and 12(b), the sound analysis processing is executed by the hearing aid 110. However, as described above, the sound analysis processing may be executed by the remote controller 150. In this case, although not illustrated in the drawings, the sound signal output from the signal processing unit 113 is transmitted from the hearing aid 110 to the remote controller 150 and the remote controller 150 analyzes the sound signal and acquires the feature amount. At this time, in the hearing aid 110, the sound analyzing unit 117 becomes unnecessary and a circuit scale decreases and consumption power is saved.

2. Second Embodiment

Configuration of TV System

Figure 15:
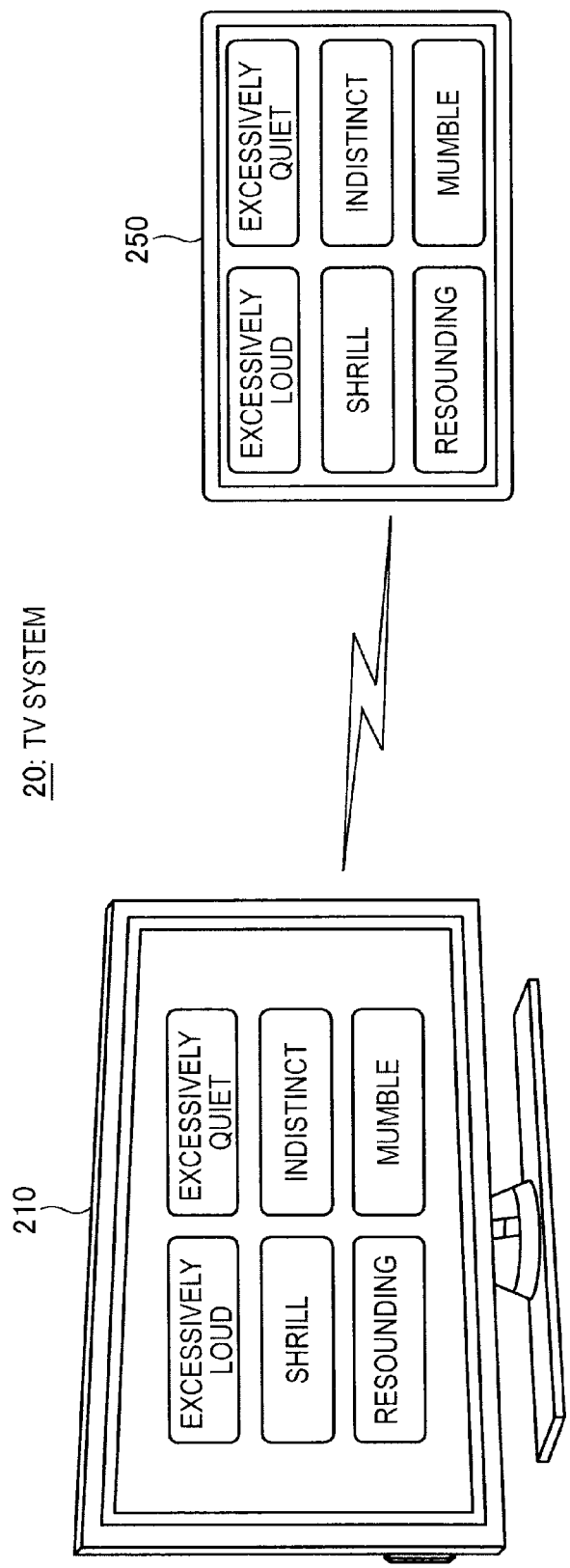
FIG. 15 is a diagram illustrating a configuration example of a TV system according to a second embodiment.

FIG. 15 illustrates a configuration example of a TV system 20 according to a second embodiment. The TV system 20 includes a television receiver (TV receiver) 210 and a remote controller 250 to control the television receiver 210.

The television receiver 210 and the remote controller 250 can perform mutual communication using wireless communication. The television receiver 210 and the remote controller 250 may perform mutual communication using another method, for example, communication based on magnetism or communication in a range in which hearing is disabled. The remote controller 250 may be a remote controller of a button type, a remote controller of a touch panel type in which provided buttons change dynamically, similar to the remote controller 150 in the hearing aid system 10 described above, or another apparatus such as a mobile terminal or a tablet terminal in which a communication mechanism is installed as a program.

The hearing aids 110L and 110R are controlled by the remote controller 250 in a state in which a user watches the television. When the user selects an item to be worried about from the impression of a television sound, for example, when the user hears a shrill sound and selects a "shrill" button, information of the selected item is transmitted to the television receiver 210 and a sound is adjusted.

Figure 16:
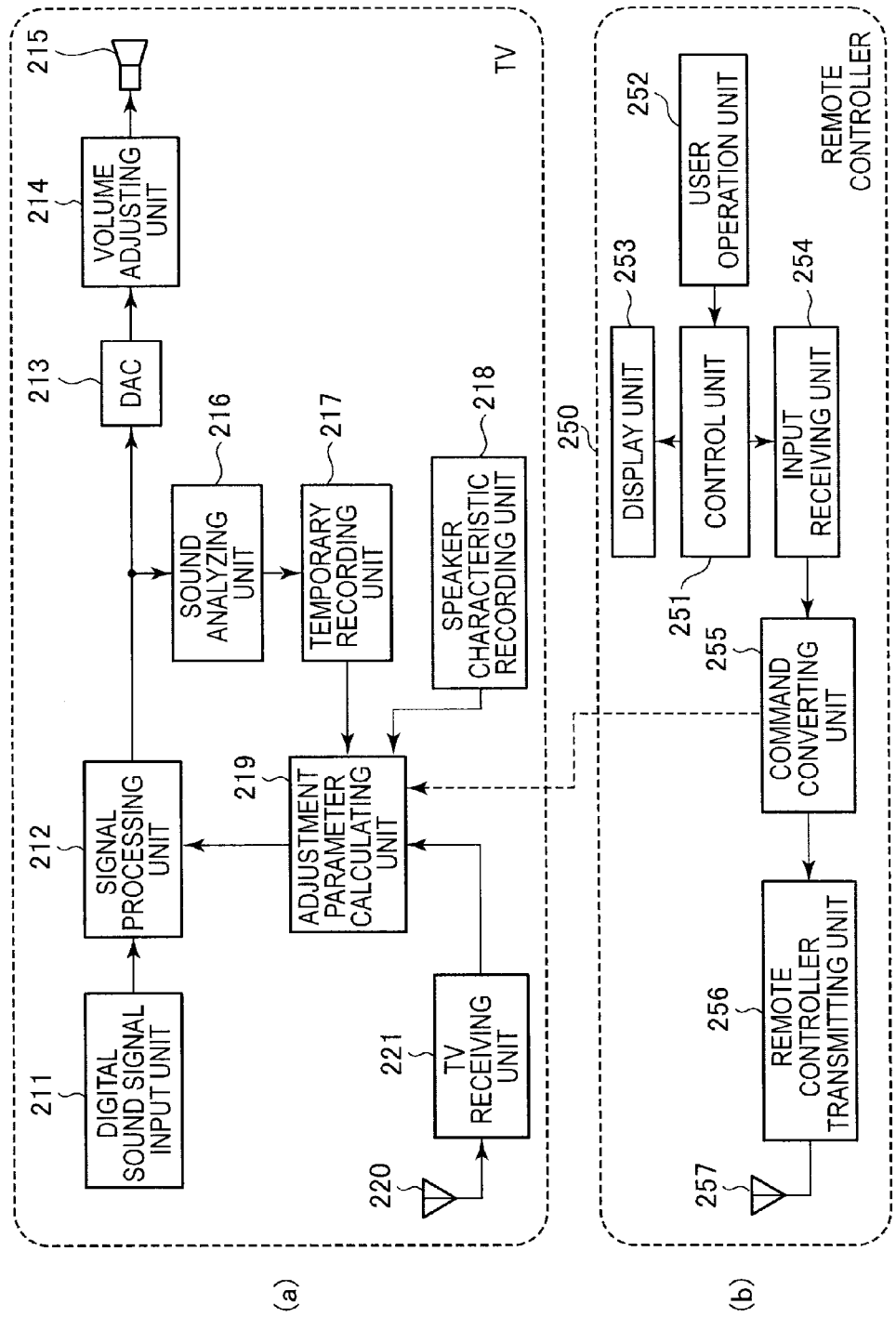
FIGS. 16(a) and 16(b) are block diagrams illustrating a configuration example of a television receiver and a configuration example of a remote controller, respectively.

FIG. 16(b) illustrates a configuration example of the remote controller 250. The remote controller 250 includes a control unit 251, a user operation unit 252, a display unit 253, an input receiving unit 254, a command converting unit 255, a remote controller transmitting unit 256, and an antenna 257.

The control unit 251 includes a CPU and controls operations of the individual units of the remote controller 250. The user operation unit 252 and the display unit 253 form a user interface. The user operation unit 252 is a unit through which the user performs various operations. For example, the user operation unit 252 is configured using a button or a touch panel. The display unit 253 is configured using a liquid crystal display.

On the display unit 253, an operation state is displayed. In addition, when a sound of the television receiver 210 is adjusted, choices ("excessively loud", "excessively quiet", and "shrill" provided to the remote controller 250 of FIG. 15) that are expressed subjectively and are associated with control with respect to a sound signal are provided (displayed) on the display unit 253. When the sound of the television receiver 210 is adjusted, the same display may be performed on a screen of the television receiver 210, at the same time as displaying of the choices on the display unit 253 of the remote controller 250. In this case, display information is transmitted from the remote controller 250 to the television receiver 210.

The input receiving unit 254 receives information of a choice selected by the user, for example, an ID of the selected choice from the control unit 251. The input receiving unit 254 may be integrated with the control unit 251. The command converting unit 255 converts information received by the input receiving unit 254 into a command associated with the information. For example, when the ID of the choice "shrill" is transmitted, the command converting unit 255 converts the ID into a command that means "shrill". The remote controller transmitting unit 256 executes transmission processing with respect to the command converted by the command converting unit 255, generates transmission information including the command, and transmits the transmission information from the antenna 257 to the television receiver 210.

FIG. 16(a) illustrates a configuration example of a sound system of the television receiver 210. The television receiver 210 includes a digital sound signal input unit 211, a signal processing unit 212, a D/A converter (DAC) 213, a volume adjusting unit 214, and a speaker 215. The television receiver 210 further includes a sound analyzing unit 216, a temporary recording unit 217, a speaker characteristic recording unit 218, an adjustment parameter calculating unit 219, an antenna 220, and a TV receiving unit 221.

The digital sound signal input unit 211 acquires a digital sound signal that is obtained by a digital tuner not illustrated in the drawings. The signal processing unit 212 executes preset effect processing, for example, processing for adding a virtual sound field and processing for amplifying a low frequency. The D/A converter 213 converts a sound signal output from the signal processing unit 212 from a digital signal to an analog signal. The volume adjusting unit 214 adjusts a volume of the sound signal obtained by the D/A converter 213 with a set value and outputs the sound signal to the speaker 215. A sound output unit is illustrated as one system to simplify explanation. However, the sound output unit may be configured as two or more systems.

Similar to the sound analyzing unit 117 illustrated in FIG. 2(a), the sound analyzing unit 216 executes sound analysis processing with respect to the digital sound signal output from the signal processing unit 212 and acquires a feature amount. The feature amount is, for example, pitch information included in a digital sound signal, power of each band after band division processing of a ⅓ octave band and a critical band, a spectrum position (frequency) of maximum power of a power spectrum obtained by performing time-frequency transform such as DFT, or a cepstrum coefficient of the power spectrum.

Similar to the temporary recording unit 118 illustrated in FIG. 2(a), the temporary recording unit 217 temporarily records the feature amount that is acquired by the sound analyzing unit 216, that is, holds the feature amount during a preset period. The speaker characteristic recording unit 218 records a characteristic of the speaker 215 as an individual parameter. The speaker characteristic is measured in advance and is recorded in the speaker characteristic recording unit 218. The TV receiving unit 221 acquires a command corresponding to a subjective sense transmitted from the remote controller 250, from information received by the antenna 220. The adjustment parameter calculating unit 219 calculates an adjustment parameter to adjust a sound signal in the signal processing unit 212, on the basis of the command acquired by the TV receiving unit 221, the feature amount of the sound signal of the processing object recorded in the temporary recording unit 217, and the speaker characteristic recorded in the speaker characteristic recording unit 218.

The adjustment parameter calculating unit 219 calculates the adjustment parameter as follows. For example, when a command corresponding to "it is hard to hear a sound" is transmitted, the adjustment parameter calculating unit 219 calculates an adjustment parameter to execute formant emphasis processing and consonant emphasis processing, from a frequency characteristic of the speaker in a sound band, for example, a band of 500 Hz to 4 kHz and pitch information recorded in a time-series record feature amount. When there is pitch information of a low sound in the pitch information recorded in the time-series record feature amount, the adjustment parameter calculating unit 219 calculates an adjustment parameter to strongly adjust a low band.

For example, the adjustment parameter calculating unit 219 calculates an adjustment parameter such that a frequency band having a superior speaker characteristic is actively used and emphasis processing is not executed with respect to a frequency band having an inferior speaker characteristic causing sound distortion. The adjustment parameter calculating unit 219 calculates an adjustment parameter such that an envelope of a power spectrum is calculated from a cepstrum coefficient of the time-series record feature amount, it is determined whether there is a background sound, it is determined that there is the background sound when there is a signal in a band higher than the sound band, and strength of compression processing of an effect sound is adjusted according to a high-frequency characteristic of the speaker when it is determined that there is the background sound.

Next, a normal operation of a sound system of the television receiver 210 will be described. The digital sound signal that is input to the digital sound signal input unit 211 is supplied to the signal processing unit 212. In the signal processing unit 212, sound signal processing such as preset effect processing and low-frequency amplification processing is executed with respect to the digital sound signal. The D/A converter 213 converts the processed digital sound signal output from the signal processing unit 212 from a digital signal to an analog signal and supplies the analog sound signal to the volume adjusting unit 214. In the volume adjusting unit 214, the volume of the analog sound signal is adjusted with a set value. The volume adjusted sound signal is supplied to the speaker 215 and the sound based on the sound signal is output from the speaker 215.

The processed digital sound signal that is output from the signal processing unit 212 is supplied to the sound analyzing unit 216. In the sound analyzing unit 216, sound analysis processing is executed with respect to the digital sound signal, a feature amount of the digital sound signal is acquired, and the acquired feature amount is supplied to the temporary recording unit 217 and is held during a preset period.

In this way, the normal operation of the sound system of the television receiver 210 is performed. In the above description, the sound analyzing unit 216 and the temporary recording unit 217 operate at all times. However, the sound analyzing unit 216 and the temporary recording unit 217 may be configured to be operated by an operation of the remote controller to decrease power consumption. In this case, a signal that starts/stops an operation after the sound analyzing unit 216 is transmitted from the remote controller receiving unit 221, by a system not illustrated in the drawings. For example, when an operation screen is displayed by a remote controller such as a touch panel, the sound analyzing unit 117 and the temporary recoding unit 217 may transmit a signal to the television receiver 210 and the television receiver 210 may receive the signal and perform an operation for validating the sound analyzing unit 216 and the temporary recording unit 217 as described above, by the received signal.

Next, an operation in the case in which the user operates the remote controller 250 will be described. In this case, it is assumed that the sound analyzing unit 216 and the temporary recording unit 217 are operated at all times, in order to simplify explanation.

When the user desires to adjust hearing, the user selects the subjective sense according to the sense to be worried about from choices provided (displayed) to the display unit 253 of the remote controller 250. In the remote controller 250, information of the choice selected by the user, for example, an ID of the selected choice is received by the input receiving unit 254 and is transmitted to the command converting unit 255.

In the command converting unit 255, the transmitted information is converted into a command associated with the information. For example, when an ID of a choice "shrill" is transmitted, the ID is converted into a command that means "shrill". The command that is obtained by the command converting unit 255 is supplied to the remote controller transmitting unit 256. In the remote controller transmitting unit 256, transmission processing is executed with respect to the command and information including the command is transmitted from the antenna 257 to the television receiver 210.

In the television receiver 210, the information that is transmitted from the remote controller 250 is received by the antenna 220 and is supplied to the TV receiver 221. In the TV receiver 221, the command corresponding to the subjective sense is taken from the received information and is supplied to the adjustment parameter calculating unit 219. In the adjustment parameter calculating unit 219, if the command is supplied from the TV receiving unit 221, an adjustment parameter corresponding to the command is calculated. In this case, the signal processing unit 212 calculates an adjustment parameter to adjust the sound signal (sound signal of the processing object), on the basis of the time-series record feature amount to be recorded in the temporary recording unit 217 and the speaker characteristic information recorded in the speaker characteristic recording unit 218.

As a method of calculating the adjustment parameter, a method of calculating the adjustment parameter by referring to only the speaker characteristic information recorded in the speaker characteristic recording unit 218 is also considered. As a method of calculating the adjustment parameter by the adjustment parameter calculating unit 219, a method of calculating the adjustment parameter without referring to both the time-series record feature amount recorded in the temporary recording unit 217 and the speaker characteristic information recorded in the speaker characteristic recording unit 218 is also considered. In this method, an adjustment parameter corresponding to a command is selected from plural preset adjustment parameters and is used.

The adjustment parameter that is calculated by the adjustment parameter calculating unit 219 as described above is supplied to the signal processing unit 212. In the signal processing unit 212, when the adjustment parameter is transmitted from the adjustment parameter calculating unit 219, a variety of signal processing is adjusted according to the adjustment parameter. As a result, the sound signal is adjusted.

As described above, in the TV system 20 illustrated in FIG. 15, the user can select the predetermined choice corresponding to subjectivity with respect to a hearing sound, from the choices provided to the display unit of the remote controller 250 and subjectively expressed. Information (command) of the selected predetermined choice is transmitted to the television receiver 210. In the television receiver 210, processing for adjusting the volume and the sound quality of the sound signal on the basis of the predetermined choice is executed. Therefore, the user can adjust the sound (the volume and the sound quality) in the television receiver 210 with a subjective sense with respect to the sound. Even if the user does not have detailed knowledge for a sound, the user can perform desired adjustment.

In the above description, the reproducing device is the television receiver. However, even when the reproducing device is another apparatus, for example, an apparatus such as an audio reproducer, a portable music reproducer, or a personal computer which outputs a sound, the reproducing device can adjust the same sound (the volume and the sound quality).

In the above description, the television receiver 210 and the remote controller 250 perform wireless communication. However, the television receiver 210 and the remote controller 250 may be configured to perform wired communication. In this case, as illustrated by a broken line in FIGS. 16(a) and 16(b), a command is supplied directly from the command converting unit 255 of the remote controller 250 to the adjustment parameter calculating unit 219 of the television receiver 210. At this time, the remote controller transmitting unit 256 and the antenna 257 of the remote controller 250 and the antenna 220 and the TV receiving unit 221 of the television receiver 210 become unnecessary.

In the above description, the TV system 20 includes the television receiver 210 and the remote controller 250. However, a choice of a subjective expression may be displayed on a screen of the television receiver 210 and the user may perform a selection operation using an operation button provided in a casing of the television receiver 210.

Figure 17:
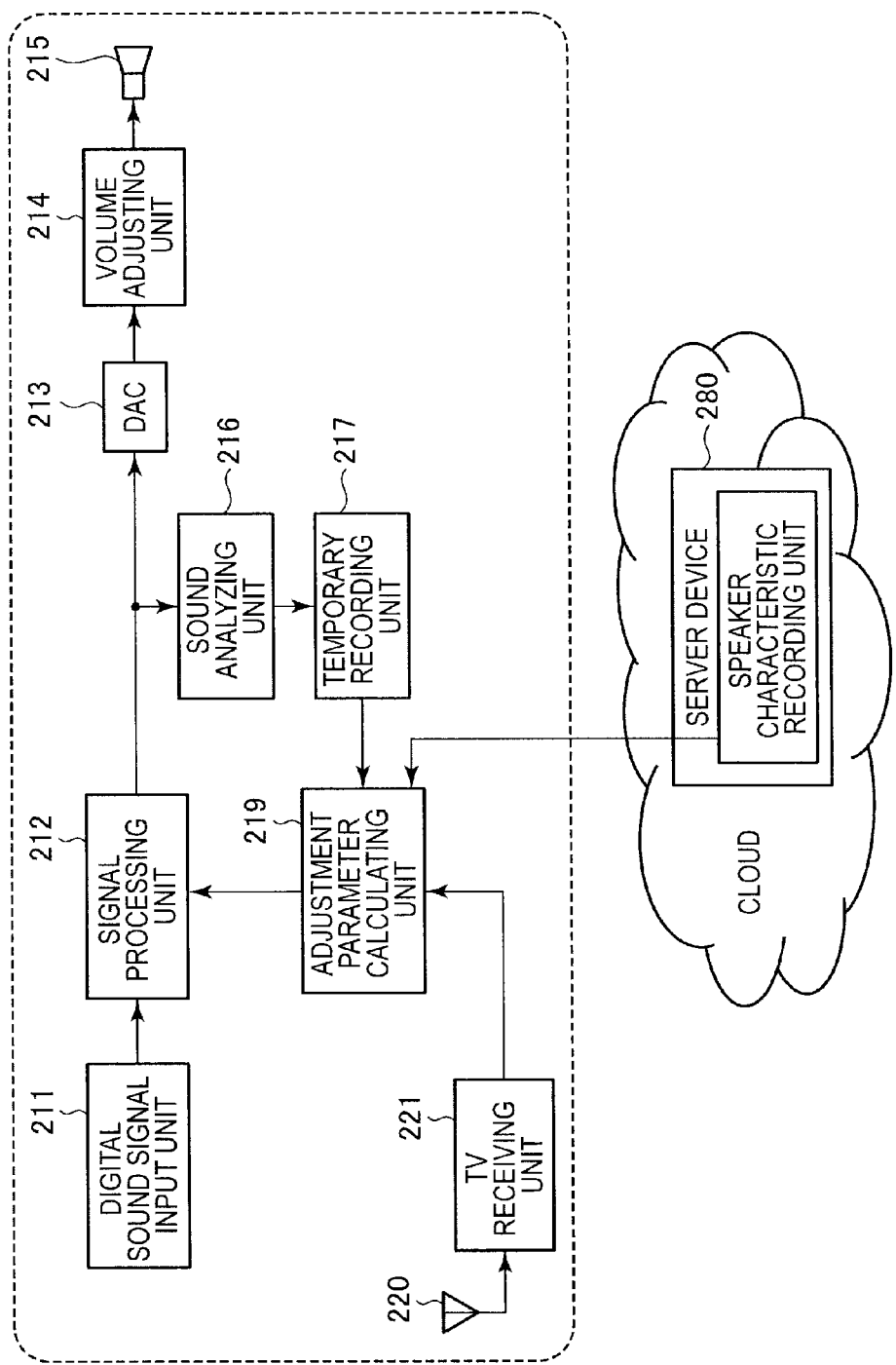
FIG. 17 is a diagram illustrating the case of using a speaker characteristic stored in a speaker characteristic recording unit in a server device on a cloud.

In the above description, the television receiver 210 has the speaker characteristic recording unit 218. However, as illustrated in FIG. 17, the television receiver 210 may use a speaker characteristic that is held in a speaker characteristic recording unit in a server device 280 on a cloud. In this case, even when an external speaker is use as the speaker 215, a speaker characteristic of the external speaker can be acquired from the server device 280 on the cloud and can be supplied to the adjustment parameter calculating unit 219. For this reason, in the adjustment parameter calculating unit 219, an adjustment parameter according to the external speaker characteristic can be appropriately calculated.

In the above description, the user instructs the command input using the button of the remote controller. However, a microphone may be arranged in the television receiver 210 and the remote controller 250 so that the command input is performed using a sound. When an arrangement place of the television receiver 210 is wide, plural microphones may be arranged, a direction of the user may be detected from sound likeliness, and a command input using a sound may be performed in a state in which directivity is turned to the detected direction. A camera may be arranged, the user may perform a specific gesture, and a command input using a sound may be performed in a state in which directivity of the microphone is turned to the direction of the user or a command input based on plural gestures may be performed using only the camera.

A multi-axial accelerator sensor may be arranged in the remote controller 250 and a command may be input by a swing method of the remote controller 250. A mechanism for configuring a user interface for performing slider control or multi-stage adjustment such as adjustment through displaying the strength and weakness in a color/temperature when a specific display item, for example, shrill is selected, instead of pressing buttons many times for adjustment, and performing adjustment with a subjective sense may be used. The interface may be displayed multi-axially, for example, with shrill and clear, an item on a space may be selected, and adjustment may be performed.

3. Third Embodiment

Configuration of Hearing Aid

Figure 18:
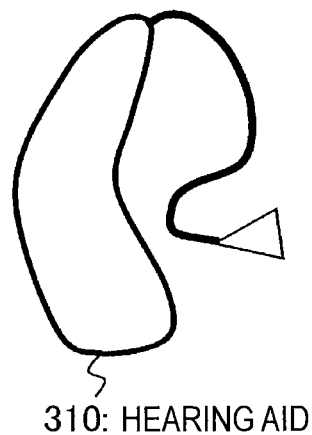
FIG. 18 is a diagram illustrating a hearing aid according to a third embodiment.

FIG. 18 illustrates a hearing aid 310 according to a third embodiment. In the first embodiment, the sound (the volume and the sound quality) of the hearing aid 110 (110L and 110R) is adjusted by the operation from the user using the remote controller 150. The hearing aid 310 can input a sound.

Figure 19:
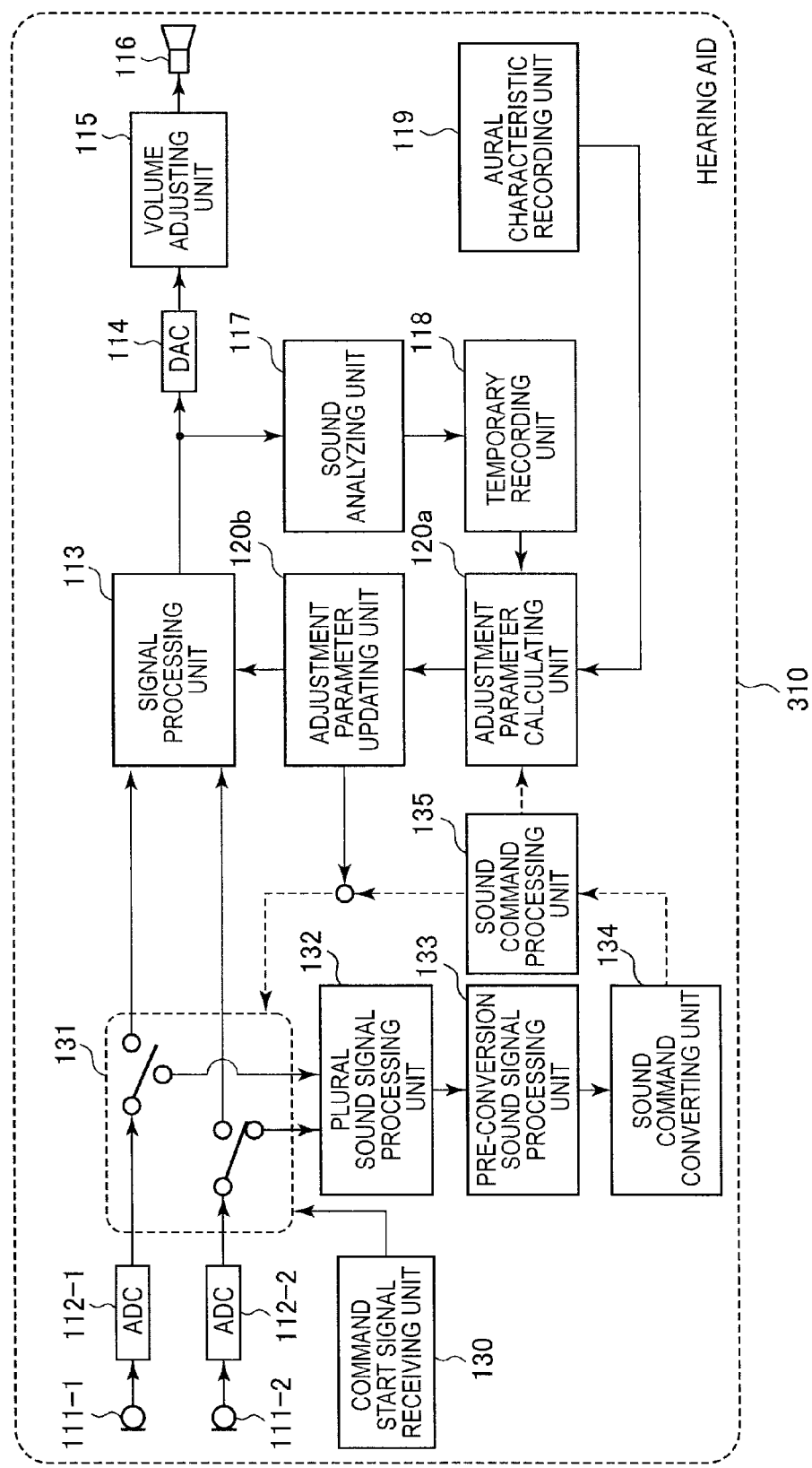
FIG. 19 is a block diagram illustrating a configuration example of the hearing aid.

FIG. 19 illustrates a configuration example of the hearing aid 310. In FIG. 19, structural elements that correspond to those of FIGS. 2(*a*) and 2(*b*) are denoted by the same reference numerals and detailed explanation thereof is appropriately omitted. The hearing aid 310 includes microphones 111-1 and 111-2, A/D converters (ADC) 112-1 and 112-2, a signal processing unit 113, a D/A converter (DAC) 114, a volume adjusting unit 115, and a speaker 116.

The hearing aid 310 further includes a sound analyzing unit 117, a temporary recording unit 118, an aural characteristic recording unit 119, an adjustment parameter calculating unit 120*a*, and an adjustment parameter updating unit 120*b*. The hearing aid 310 further includes a command start signal receiving unit 130, a switching unit 131, a plural sound signal processing unit 132, a pre-conversion sound signal processing unit 133, a sound command converting unit 134, and a sound command processing unit 135.

The microphones 111-1 and 111-2 pick up an ambient sound and obtain a sound signal. The two microphones 111-1 and 111-2 are included to enable processing for controlling directivity. The number of microphones may be one or may be three or more. The A/D converters 112-1 and 112-2 convert the sound signal obtained by the microphones 111-1 and 111-2 from an analog signal to a digital signal.

The signal processing unit 113 executes various processing with respect to the sound signal (sound signal of a processing object) obtained by the A/D converters 112-1 and 112-2. The D/A converter 114 converts a sound signal output from the signal processing unit 113 from a digital signal to an analog signal. The volume adjusting unit 115 adjusts a volume of the sound signal obtained by the D/A converter 114 with a set value and outputs the sound signal to the speaker 116.

The sound analyzing unit 117 executes sound analysis processing with respect to the digital sound signal output from the signal processing unit 113 and acquires a feature amount. The temporary recording unit 118 temporarily records the feature amount that is acquired by the sound analyzing unit 117, that is, holds the feature amount during a preset period. The adjustment parameter calculating unit 120*a* calculates an adjustment parameter to adjust a sound signal in the signal processing unit 113, on the basis of a sound input command, the feature amount of the processing object recorded in the temporary recording unit 118, and the aural characteristic recorded in the aural characteristic recording unit 119. The adjustment parameter updating unit 120*b* sets the calculated adjustment parameter to the signal processing unit 113. The adjustment parameter calculating unit 120 illustrated in FIG. 2(*a*) corresponds to the adjustment parameter calculating unit 120*a* and the adjustment parameter updating unit 120*b*.

The switching unit 131 selectively supplies the digital sound signal output from the A/D converters 112-1 and 112-2 to the signal processing unit 113 or the plural sound signal processing unit 132. When the command start signal receiving unit 130 receives a control signal to instruct the start of the sound command input, the command start signal receiving unit 130 starts a preparation for the sound command input. When a prescribed button of the hearing aid 310 is operated by the user, the command start signal receiving unit 130 receives the control signal of the start instruction.

When the command start signal receiving unit 130 receives the control signal of the start instruction, the command start signal receiving unit 130 supplies a switching signal to the switching unit 131. Thereby, switching is performed from a state in which the digital sound signal output from the A/D converters 112-1 and 112-2 is supplied to the signal processing unit 113 to a state in which the digital sound signal is supplied to the plural sound signal processing unit 132.

The plural sound signal processing unit 132 synthesizes plural digital sound signals (in this embodiment, two digital sound signals), considers a phase difference from a position relation of plural microphones determined at the time of a design, and turns directivity to the front of the user. The pre-conversion sound signal processing unit 133 executes processing for generating a sound signal to be transmitted to the sound command converting unit 134. For example, the pre-conversion sound signal processing unit 133 executes processing for suppressing the outside of a frequency band determined at the time of the design, for example, a frequency band (200 Hz to 3 kHz) of the sound, converts a frequency into a sampling frequency determined at the time of the design, and specifies a superior sound signal section from amplitude strength of the sound signal.

The sound command converting unit 134 executes processing such as sound recognition processing and converts the sound signal into a sound command. The sound command processing unit 135 executes processing according to the conversion result of the sound command in the sound command converting unit 134. That is, when the sound signal can be converted into the sound command, the sound command processing unit 135 transmits the sound command to the adjustment parameter calculating unit 120*a*. Meanwhile, when the sound signal may not be converted into the sound command, the sound command processing unit 135 transmits a control signal for switching into the signal processing unit 113 to the switching unit 131.

Next, a normal operation of the hearing aid 310 will be described. An ambient sound is picked up by the microphones 111-1 and 111-2 and an analog sound signal corresponding to the picked-up sound is obtained from the microphones 111-1 and 111-2. The A/D converters 112-1 and 112-2 convert the analog sound signal from an analog signal to a digital signal.

In the normal operation, the switching unit 131 is switched into the side of the signal processing unit 113. For this reason, the digital sound signal that is output from the A/D converts 112-1 and 112-2 is supplied to the signal processing unit 113. In the signal processing unit 113, preset sound signal processing is executed with respect to the digital sound signal. The D/A converter 114 converts the processed digital sound signal output from the signal processing unit 113 from a digital signal to an analog signal and supplies the analog sound signal to the volume adjusting unit 115. In the volume adjusting unit 115, the volume of the analog sound signal is adjusted with a set value. The volume adjusted sound signal is supplied to the speaker 116 and the sound based on the sound signal is output from the speaker 116.

The processed digital sound signal that is output from the signal processing unit 113 is supplied to the sound analyzing unit 117. In the sound analyzing unit 117, sound analysis processing is executed with respect to the digital sound signal, a feature amount of the digital sound signal is acquired, and the acquired feature amount is supplied to the temporary recording unit 118 and is held during a preset period.

Next, an operation in the case in which the user operates a prescribed button of the hearing aid 310 and instructs the hearing aid 310 to start the sound command input will be described. In this case, a command start signal from a control unit not illustrated in the drawings is received by the command start signal receiving unit 130. A switching signal is supplied from the command start signal receiving unit 130 to the switching unit 131 and the switching unit 131 is switched into a state in which the digital sound signal from the A/D converts 112-1 and 112-2 is supplied to the plural sound signal processing unit 132.

In the plural sound signal processing unit 132, the two sound signals are synthesized such that a phase difference is considered from a position relation of plural microphones determined at the time of the design and the directivity is turned to the front of the user. The sound signal that is processed by the plural sound signal processing unit 132 is supplied to the pre-conversion sound signal processing unit 133.

In the pre-conversion sound signal processing unit 133, processing for generating a sound signal to be supplied to the sound command converting unit 134 is executed with respect to the sound signal supplied from the plural sound signal processing unit 132. For example, in the pre-conversion sound signal processing unit 133, processing for suppressing the outside of a frequency band determined at the time of the design, for example, a frequency band (200 Hz to 3 kHz) of the sound is executed, a frequency is converted into a sampling frequency determined at the time of the design, and a superior sound signal section is specified from amplitude strength of the sound signal.

The sound signal that is processed by the pre-conversion sound signal processing unit 133 is supplied to the sound command converting unit 134. In the sound command converting unit 134, processing such as sound recognition processing is executed and the sound signal is converted into a sound command. The conversion result of the sound command converting unit 134 is transmitted to the sound command processing unit 135. In the sound command processing unit 135, when the sound signal can be converted into the sound command, the sound command is transmitted to the adjustment parameter calculating unit 120*a*. Meanwhile, when the sound signal may not be converted into the sound command, a control signal for switching into the side of the signal processing unit 113 is transmitted to the switching unit 131.

In the adjustment parameter calculating unit 120*a*, if the sound command is transmitted from the sound command processing unit 135, the adjustment parameter is calculated. In this case, the signal processing unit 113 calculates the adjustment parameter to adjust the sound signal (sound signal of the processing object), on the basis of the sound command, the time-series record feature amount recorded in the temporary recording unit 118, and the aural characteristic information recorded in the aural characteristic recording unit 119. The adjustment parameter is set to the signal processing unit 113 by the adjustment parameter updating unit 120*b*.

As such, after the adjustment parameter is set to the signal processing unit 113 by the adjustment parameter updating unit 120*b*, a control signal for switching into the side of the signal processing unit 113 is transmitted from the adjustment parameter updating unit 120*b* to the switching unit 131. Thereby, the hearing aid 310 enters the normal operation state described above and the signal processing unit 113 executes signal processing based on a newly set adjustment parameter.

As described above, the switching unit 131 is switched into the side of the plural sound signal processing unit 132 until the command processing is completed after the sound command input starts. For this reason, hearing aid processing is stopped. However, the sound signal may be supplied to the signal processing unit 113 at all times and the hearing aid processing may be executed during the sound command input. In this case, it is preferable to stop the sound analyzing unit 117 and the temporary recording unit 118.

Figure 20:
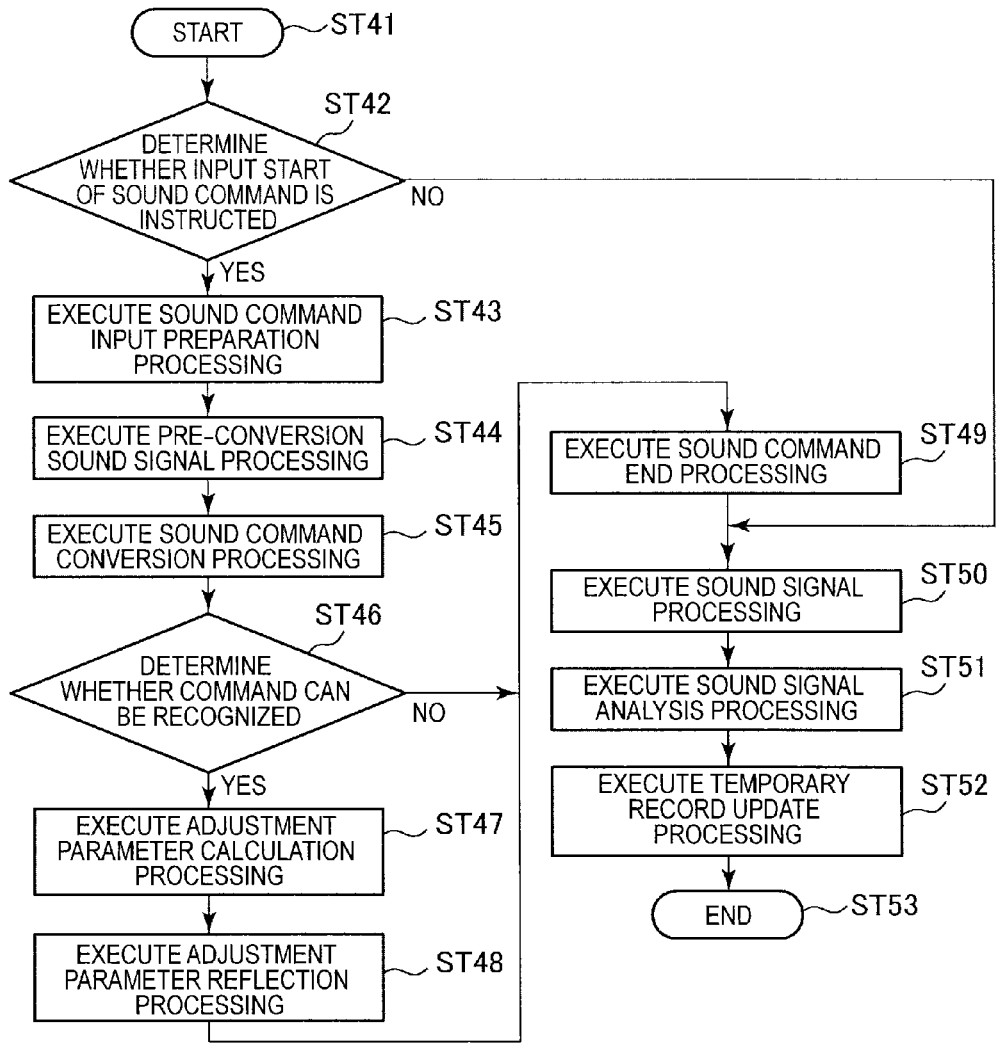
FIG. 20 is a flowchart illustrating a flow of processing of the hearing aid.

A flowchart of FIG. 20 illustrates a flow of processing of the hearing aid 310. The hearing aid 310 executes the processing periodically or according to an explicit instruction from the user. In step ST41, the hearing aid 310 starts the processing. In step ST42, the hearing aid 310 determines whether the input start of the sound command is instructed by the user. The hearing aid 310 determines that the input start of the sound command is instructed, when the command start signal receiving unit 130 receives the control signal to instruct the input start of the sound command. When the input start of the sound command is instructed, the hearing aid 310 makes the processing proceed to sound command input preparation processing of step ST43.

In the sound command input preparation processing, the hearing aid 310 performs an input preparation of the sound command, for example, control of the switching unit 113. In step ST44, the hearing aid 310 executes pre-conversion sound signal processing, that is, processing in the plural sound signal processing unit 132 and the pre-conversion sound signal processing unit 133, with respect to the sound signal.

Next, in step ST45, the hearing aid 310 executes command conversion processing with respect to the sound signal processed in step ST44. In the command conversion processing, the hearing aid 310 executes sound recognition processing and converts the sound signal into the sound command. When the sound signal may not be converted into the sound command, the hearing aid 310 executes processing for notifying that the sound command is not obtained.

Next, in step ST46, the hearing aid 310 determines whether the sound command can be recognized. When the sound command can be recognized, in step ST47, the hearing aid 310 executes adjustment parameter calculation processing. In step ST48, the hearing aid 310 executes adjustment parameter reflection processing. After step ST48, the hearing aid 310 makes the processing proceed to sound command end processing of step ST49. In the sound command end processing, the hearing aid 310 executes the sound command end processing, for example, processing for returning the switching unit 131 to the side of the signal processing unit 131.

Next, the hearing aid 310 makes the processing proceed to sound signal processing of step ST50. When it is determined in step ST42 that the input instruction of the sound command is not instructed, the hearing aid 310 makes the processing proceed to the sound signal processing of step ST50 immediately. In the sound signal processing, the hearing aid 310 executes the sound signal processing to improve hearing and outputs the sound signal to the speaker, by a system not illustrated in the drawings.

Next, the hearing aid 310 makes the processing proceed to sound signal analysis processing of step ST51. In the sound signal analysis processing, the hearing aid 310 executes the sound signal analysis processing to calculate the feature amount used in the adjustment parameter calculation processing. After executing the processing of step ST51, the hearing aid 310 makes the processing proceed to temporary record update processing of step ST52. After the processing of step ST52, in step ST53, the hearing aid 310 ends the processing.

As described above, in the hearing aid 310 illustrated in FIGS. 18 and 19, the user can adjust the sound (the volume and the sound quality) in the hearing aid 310 with a subjective sense with respect to the sound. Even if the user does not have detailed knowledge for a sound, the user can perform desired adjustment. In this case, the user can perform the sound input of the subjectively expressed command and can improve usability.

The input sound may be a command name. However, the input sound may be an abbreviation that is allocated arbitrarily by the user. In this case, the input sound may be set by the user in advance, may be recorded in a record area not illustrated in the drawings, and may be referred to in the sound command conversion processing.

4. Fourth Embodiment

Configuration of Hearing Aid

Figure 21:
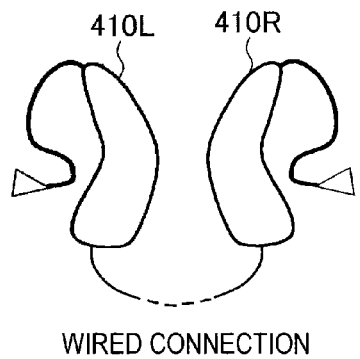
FIG. 21 is a diagram illustrating a hearing aid according to a fourth embodiment.

FIG. 21 illustrates a pair of hearing aids 410L and 410R according to a fourth embodiment. The hearing aids 410L and 410R are connected by wire and can communicate with each other. Similar to the hearing aid 310 according to the third embodiment described above, the hearing aids 410L and 410R enable an input of a sound command. In the fourth embodiment, one microphone is attached to each hearing aid and the input start of the sound command is instructed by the user, similar to the third embodiment described above.

The two hearing aids are a main hearing aid and a sub hearing aid, respectively. If the input of the sound command starts, a sound input with respect to the sub hearing aid is transmitted to the main hearing aid, sound command conversion is performed by the main hearing aid, and a recognized command returns to the sub hearing aid. In this embodiment, the hearing aid through which the user instructs the input of the sound command becomes the main hearing aid.

In this embodiment, the communication between the two hearing aids is performed by the wired communication. However, if an appropriate method is used, the communication between the two hearing aids may be performed by the wireless communication. The two hearing aids may perform the main operation together. In this case, the two hearing aids transmit a sound signal to each other and it becomes unnecessary to return a recognized command.

FIGS. 22(a) and 22(b) illustrate configuration examples of hearing aids 410L and 410R, respectively. In FIGS. 22(a) and 22(b), structural elements that correspond to those of FIGS. 1 and 19 are denoted by the same reference numerals and detailed explanation thereof is appropriately omitted. FIG. 22(a) illustrates a configuration example of one hearing aid 410a of the hearing aids 410L and 410R. FIG. 22(b) illustrates a configuration example of the other hearing aid 410b of the hearing aids 410L and 410R.

The hearing aid 410a includes one microphone 111, an A/D converter (ADC) 112, a signal processing unit 113, a D/A converter (DAC) 114, a volume adjusting unit 115, and a speaker 116. The hearing aid 410a further includes a sound analyzing unit 117, a temporary recording unit 118, an aural characteristic recording unit 119, an adjustment parameter calculating unit 120a, and an adjustment parameter updating unit 120b. The hearing aid 310a further includes a plural sound signal processing unit 132, a pre-conversion sound signal processing unit 133, a sound command converting unit 134, a sound command processing unit 135, a switching unit 136, a sub sound signal transmitting/receiving unit 137, a command start signal transmitting/receiving unit 138, and a sound command transmitting/receiving unit 139.

The switching unit 136 selectively supplies the digital sound signal output from the A/D converter 112 to the plural sound signal processing unit 132 or the sub sound signal transmitting/receiving unit 137. When the command start signal transmitting/receiving unit 138 receives a control signal to instruct an input start of a sound command by an operation from the user, the command start signal transmitting/receiving unit 138 starts a preparation for the sound command input. The user can operate a prescribed button of the hearing aid 410a and instruct the input start of the sound command.

When the command start signal transmitting/receiving unit 138 receives the control signal of the start instruction, the command start signal transmitting/receiving unit 138 sets the hearing aid 410a to a "main hearing aid" and transmits the control signal to instruct the sound command input start to the other hearing aid 410b that becomes a "sub hearing aid". At this time, the command start signal transmitting/receiving unit 138 supplies a switching signal to the switching unit 136, such that connection switching is performed from the side of c to the side of a. That is, the digital sound signal is supplied from the A/D converter 112 to the plural sound signal processing unit 132. At this time, the command start signal transmitting/receiving unit 138 transmits a control signal to instruct reception to the sub sound signal transmitting/receiving unit 137. In addition, the command start signal transmitting/receiving unit 138 transmits a control signal to instruct transmission of the sound command to the sound command processing unit 135 and the sound command transmitting/receiving unit 139.

When the command start signal transmitting/receiving unit 138 receives the control signal to instruct the input start of the sound command from the other hearing aid 410b, the command start signal transmitting/receiving unit 138 starts a preparation for the sound command input. When the command start signal transmitting/receiving unit 138 receives the control signal of the start instruction, the command start signal transmitting/receiving unit 138 sets the hearing aid 410a to the "sub hearing aid". At this time, the command start signal transmitting/receiving unit 138 supplies a switching signal to the switching unit 136, such that connection switching is performed from the side of c to the side of b. That is, the digital sound signal is supplied from the A/D converter 112 to the sub sound signal transmitting/receiving unit 137. The command start signal transmitting/receiving unit 138 transmits a control signal to instruct transmission to the sub sound signal transmitting/receiving unit 137. In addition, the command start signal transmitting/receiving unit 138 transmits a control signal to instruct reception of the sound command to the sound command processing unit 135 and the sound command transmitting/receiving unit 139.

The sub sound signal transmitting/receiving unit 137 receives the sound signal from the other hearing aid 410b or transmits the sound signal to the other hearing aid 410b. That is, when the control signal to instruct the reception is transmitted from the command start signal transmitting/receiving unit 138, the sub sound signal transmitting/receiving unit 137 receives the sound signal from the other hearing aid 410b and transmits the received sound signal to the plural sound signal processing unit 132. When the control signal to instruct the transmission is transmitted from the command start signal transmitting/receiving unit 138, the sub sound signal transmitting/receiving unit 137 transmits the sound signal to the other hearing aid 410b and transmits the sound signal supplied from the switching unit 136 to the other hearing aid 410b.

The sound command transmitting/receiving unit 139 transmits the sound command to the other hearing aid 410b or receives the sound command from the other hearing aid 410b. That is, when the control signal to instruct the transmission is transmitted from the command start signal transmitting/receiving unit 138, the sound command transmitting/receiving unit 139 transmits the sound command to the other hearing aid 410b and transmits the sound command from the sound command processing unit 135 or a command showing that conversion is disabled to the other hearing aid 410b. When the control signal to instruct the reception is transmitted from the command start signal transmitting/receiving unit 138, the sound command transmitting/receiving unit 139 receives the sound signal from the other hearing aid 410b. In addition, the sound command transmitting/receiving unit 139 receives the sound command from the other hearing aid 410b and transmits the sound command to the sound command processing unit 135.

The sound command processing unit 135 supplies the sound command to the adjustment parameter calculating unit 120a and processes transmission/reception of the sound command with respect to the other hearing aid 410b. When the control signal to instruct the transmission is transmitted from the command start signal transmitting/receiving unit 138, the sound command processing unit 135 executes processing according to the conversion result of the sound command in the sound command converting unit 134. That is, when the command conversion is enabled, the sound command processing unit 135 transmits the sound command to the adjustment parameter calculating unit 120a and the sound command transmitting/receiving unit 139. Meanwhile, when the command conversion is disabled, the sound command processing unit 135 transmits a command showing that the command conversion is disabled to the adjustment parameter calculating unit 120a and the sound command transmitting/receiving unit 139 and transmits a control signal for switching into the side of c to the switching unit 136. When the control signal to instruct reception is transmitted from the command start signal transmitting/receiving unit 138, the sound command processing unit 135 transmits the sound command received by the sound command transmitting/receiving unit 139 to the adjustment parameter calculating unit 120a.

Figure 22:
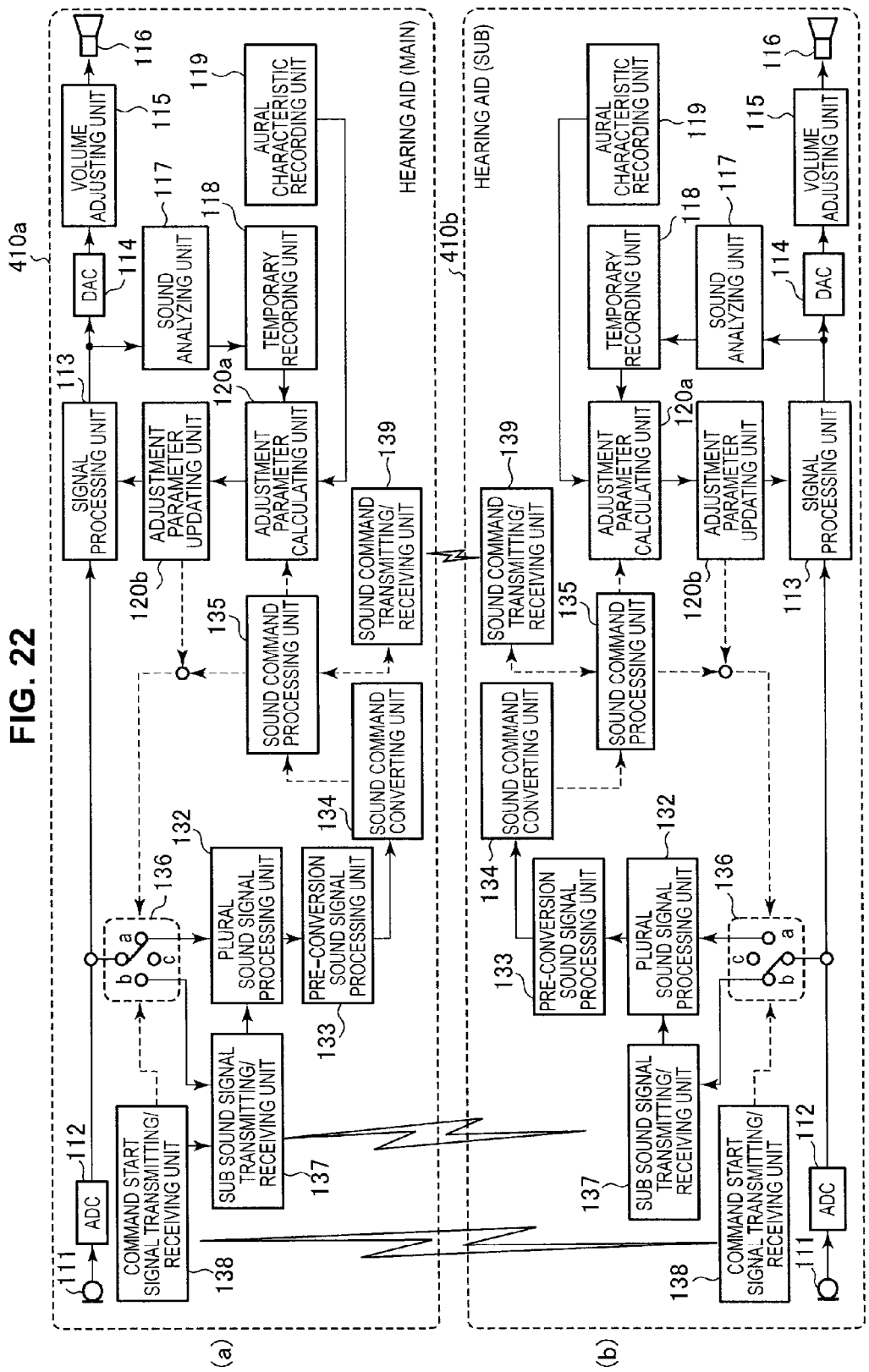
FIGS. 22(a) and 22(b) are block diagrams illustrating configuration examples of the hearing aid.

The other configuration of the hearing aid 410a illustrated in FIG. 22(*a*) is the same as that of the hearing aid 310 illustrated in FIG. 19. Because the hearing aid 410b illustrated in FIG. 22(*b*) has the same configuration as that of the hearing aid 410a described above, explanation thereof is omitted.

Next, a normal operation of the hearing aids 410a and 410b will be described. An ambient sound is picked up by the microphone 111 and an analog sound signal corresponding to the picked-up sound is obtained from the microphone 111. The A/D converter 112 converts the analog sound signal from an analog signal to a digital signal and supplies the digital sound signal to the signal processing unit 113.

In the signal processing unit 113, preset sound signal processing is executed with respect to the digital sound signal. The D/A converter 114 converts the processed digital sound signal output from the signal processing unit 113 from a digital signal to an analog signal and supplies the analog sound signal to the volume adjusting unit 115. In the volume adjusting unit 115, the volume of the analog sound signal is adjusted with a set value. The volume adjusted sound signal is supplied to the speaker 116 and the sound based on the sound signal is output from the speaker 116.

The processed digital sound signal that is output from the signal processing unit 113 is supplied to the sound analyzing unit 117. In the sound analyzing unit 117, sound analysis processing is executed with respect to the digital sound signal, a feature amount of the digital sound signal is acquired, and the acquired feature amount is supplied to the temporary recording unit 118 and is stored during a preset period.

Next, an operation in the case in which the user operates a prescribed button and instructs the hearing aid 410a or 410b to start the sound command input will be described. Herein, the case in which an instruction of the start of the sound command input from the user is given in the hearing aid 410a will be described.

First, an operation of the hearing aid 410a will be described. In this case, the control signal to instruct the input start of the sound command by the operation from the user is received by the command start signal transmitting/receiving unit 138 and a preparation for the sound command input starts. At this time, the command start signal transmitting/receiving unit 138 sets the hearing aid 410a to the "main hearing aid" and transmits the control signal to instruct the sound command input start to the other hearing aid 410b that becomes the "sub hearing aid".

In this case, the switching signal is supplied from the command start signal transmitting/receiving unit 138 to the switching unit 136, the switching unit 136 performs connection switching from the side of c to the side of a, and the digital sound signal (main sound signal) is supplied from the A/D converter 112 to the plural sound signal processing unit 132. In addition, the control signal to instruct the reception is transmitted from the command start signal transmitting/receiving unit 138 to the sub sound signal transmitting/receiving unit 137 and the sound signal transmitted from the hearing aid 410b is received. In addition, the control signal to instruct the transmission of the sound command is transmitted from the command start signal transmitting/receiving unit 138 to the sound command processing unit 135 and the sound command transmitting/receiving unit 139 and the sound command is transmitted to the hearing aid 410b.

The sound signal (sub sound signal) from the hearing aid 410b that is received by the sub sound signal transmitting/receiving unit 137 is supplied to the plural sound signal processing unit 132. In the plural sound signal processing unit 132, the sound signals (main sound signal and the sub sound signal) from the two microphones 111 of the hearing aids 410a and 410b are synthesized such that a phase difference is considered from a position relation of the two microphones determined at the time of the design and the directivity is turned to the front of the user. The sound signal that is processed by the plural sound signal processing unit 132 is supplied to the pre-conversion sound signal processing unit 133.

In the pre-conversion sound signal processing unit 133, processing for generating a sound signal to be supplied to the sound command converting unit 134 is executed with respect to the sound signal supplied from the plural sound signal processing unit 132. For example, in the pre-conversion sound signal processing unit 133, processing for suppressing the outside of a frequency band determined at the time of the design, for example, a frequency band (200 Hz to 3 kHz) of the sound is executed, a frequency is converted into a sampling frequency determined at the time of the design, and a superior sound signal section is specified from amplitude strength of the sound signal.

The sound signal that is processed by the pre-conversion sound signal processing unit 133 is supplied to the sound command converting unit 134. In the sound command converting unit 134, processing such as sound recognition processing is executed and the sound signal is converted into a sound command. The conversion result of the sound command converting unit 134 is transmitted to the sound command processing unit 135. In the sound command processing unit 135, when the sound signal can be converted into the sound command, the sound command is transmitted to the adjustment parameter calculating unit 120*a*. In this case, the sound command is also transmitted to the sound command transmitting/receiving unit 139 and the sound command is transmitted to the hearing aid 410*b*. Meanwhile, in the sound command processing unit 135, when the sound signal may not be converted into the sound command, a command showing that the sound signal may not be converted into the sound command is transmitted to the adjustment parameter calculating unit 120*a* and the sound command transmitting/receiving unit 139. In this case, in the sound command processing unit 135, the control signal for switching into the side of c is transmitted to the switching unit 131 and the switching unit 136 is switched into the side of c and enters a normal state.

In the adjustment parameter calculating unit 120*a*, if the sound command is transmitted from the sound command processing unit 135, the adjustment parameter is calculated. In this case, the signal processing unit 113 calculates the adjustment parameter to adjust the sound signal (sound signal of the processing object), on the basis of the sound command, the time-series record feature amount recorded in the temporary recording unit 118, and the aural characteristic information recorded in the aural characteristic recording unit 119. The adjustment parameter is set to the signal processing unit 113 by the adjustment parameter updating unit 120*b*.

As such, after the adjustment parameter is set to the signal processing unit 113 by the adjustment parameter updating unit 120*b*, a control signal for switching into the side of c is transmitted from the adjustment parameter updating unit 120*b* to the switching unit 136. Thereby, the hearing aid 410*a* enters the normal operation state described above and the signal processing unit 113 executes signal processing based on a newly set adjustment parameter.

Next, an operation of the hearing aid 410*b* will be described. In this case, the control signal to instruct the input start of the sound command from the hearing aid 410*a* is received by the command start signal transmitting/receiving unit 138 and a preparation for the sound command input starts. At this time, the command start signal transmitting/receiving unit 138 sets the hearing aid 410*b* to the "sub hearing aid".

In this case, the switching signal is supplied from the command start signal transmitting/receiving unit 138 to the switching unit 136, the switching unit 136 performs connection switching from the side of c to the side of b, and the digital sound signal (main sound signal) is supplied from the A/D converter 112 to the sub sound signal transmitting/receiving unit 137. In addition, the control signal to instruct the transmission is transmitted from the command start signal transmitting/receiving unit 138 to the sub sound signal transmitting/receiving unit 137 and the sound signal supplied from the switching unit 136 is transmitted to the hearing aid 410*a*.

In this case, the control signal to instruct the reception of the sound command is transmitted from the command start signal transmitting/receiving unit 138 to the sound command processing unit 135 and the sound command transmitting/receiving unit 139 and the sound command is received from the hearing aid 410*a*. At this time, the plural sound signal processing unit 132, the pre-conversion sound signal processing unit 133, and the sound command converting unit 134 do not operate.

In the sound command transmitting/receiving unit 139, the sound command transmitted from the hearing aid 410*a* or the command showing that the conversion is disabled is received. The sound command is transmitted to the adjustment parameter calculating unit 120*a* through the sound command processing unit 135. Meanwhile, the command showing that the conversion is disabled is transmitted to the sound command processing unit 135. In the sound command processing unit 135, the command showing that the conversion is disabled becomes a trigger, a control signal for switching into the side of c is transmitted to the switching unit 136, and the switching unit 136 is switched into the side of c and enters a normal state.

In the adjustment parameter calculating unit 120*a*, if the sound command is transmitted from the sound command processing unit 135, the adjustment parameter is calculated. In this case, the signal processing unit 113 calculates the adjustment parameter to adjust the sound signal (sound signal of the processing object), on the basis of the sound command, the time-series record feature amount recorded in the temporary recording unit 118, and the aural characteristic information recorded in the aural characteristic recording unit 119. The adjustment parameter is set to the signal processing unit 113 by the adjustment parameter updating unit 120*b*.

As such, after the adjustment parameter is set to the signal processing unit 113 by the adjustment parameter updating unit 120*b*, a control signal for switching into the side of c is transmitted from the adjustment parameter updating unit 120*b* to the switching unit 136. Thereby, the hearing aid 410*b* enters the normal operation state described above and the signal processing unit 113 executes signal processing based on a newly set adjustment parameter.

Figure 23:
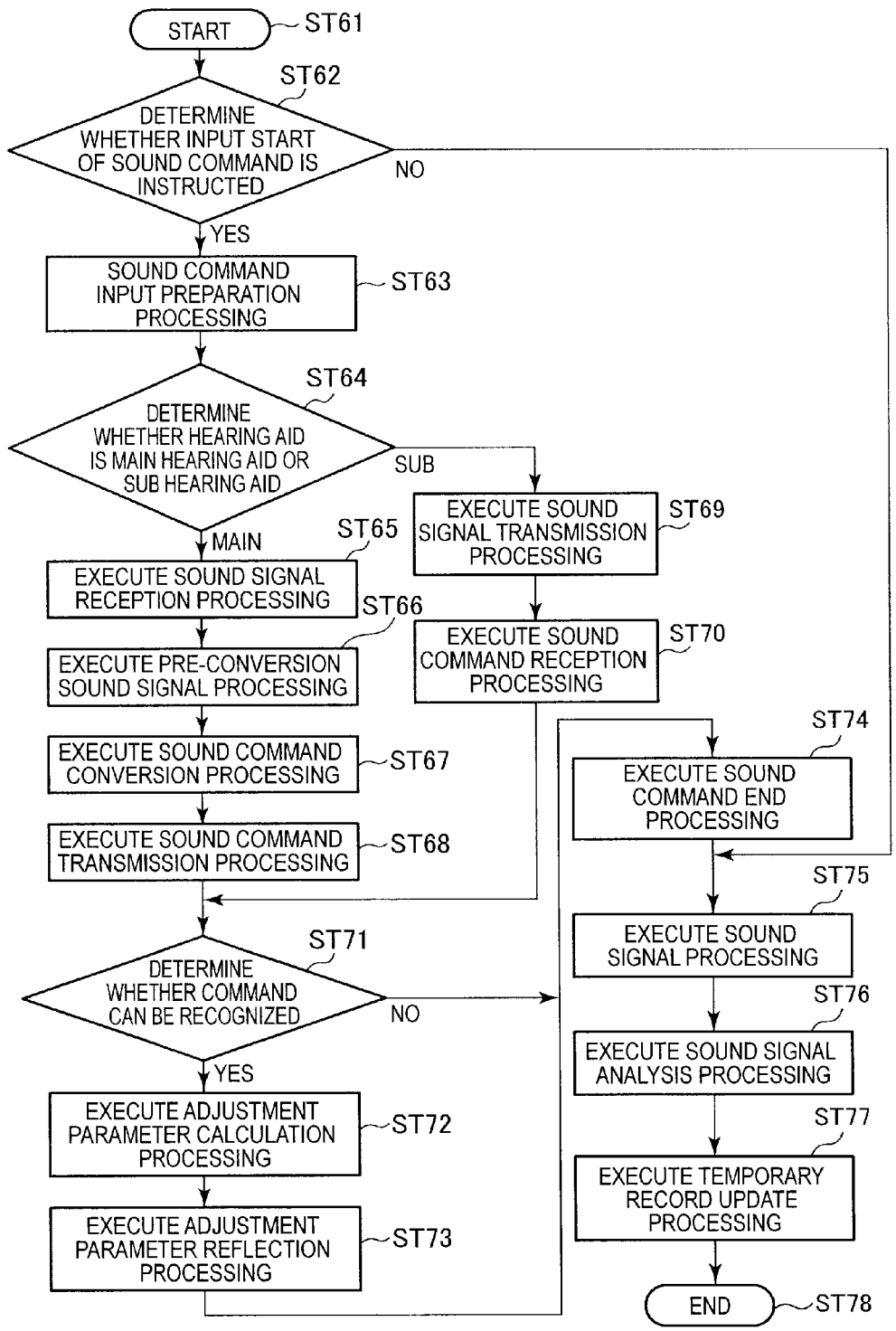
FIG. 23 is a flowchart illustrating a flow of processing of the hearing aid.

A flowchart of FIG. 23 illustrates a flow of processing of the hearing aid 410 (410*a* and 410*b*). The hearing aid 410 executes the processing periodically or according to an explicit instruction from the user. In step ST61, the hearing aid 410 starts the processing. In step ST62, the hearing aid 410 determines whether the input start of the sound command is instructed by the user. The hearing aid 410 determines that the input start of the sound command is instructed, when the command start signal transmitting/receiving unit 138 receives the control signal to instruct the input start of the sound command. When the input start of the sound command is instructed, the hearing aid 410 makes the processing proceed to sound command input preparation processing of step ST63.

In the sound command input preparation processing, the hearing aid 410 performs an input preparation of the sound command, for example, control of the switching unit 113 and sets "main" or "sub". The hearing aid 410 sets "main" when the control signal to instruct the input start of the sound command by the user operation performed by the hearing aid is received and sets "sub" when the control signal to instruct the input start of the sound command is received from the other hearing aid.

Next, in step ST64, the hearing aid 410 determines whether the hearing aid is the "main" hearing aid or the "sub" hearing aid. When the hearing aid is the "main" hearing aid, the hearing aid 410 makes the processing proceed to processing of step ST65. In step ST65, the hearing aid 410 receives the sound signal (sub sound signal) from the other hearing aid. In step ST66, the hearing aid 410 executes pre-conversion sound signal processing, that is, processing in the plural sound signal processing unit 132 and the pre-conversion sound signal processing unit 133, with respect to the sound signal.

Next, in step ST67, the hearing aid 410 executes command conversion processing with respect to the sound signal processed in step ST66. In the command conversion processing, the hearing aid 410 executes sound recognition processing and converts the sound signal into the sound command. When the sound signal may not be converted into the sound command, the hearing aid 410 executes processing for notifying that the sound command is not obtained. In step ST68, the hearing aid 410 transmits the converted sound command to the other hearing aid. After the processing of step ST68, the hearing aid 410 makes the processing proceed to processing of step ST71.

When it is determined in step ST64 that the hearing aid is the "sub" hearing aid, the hearing aid 410 makes the processing proceed to processing of step ST69. In step ST69, the hearing aid 41 transmits the sound signal (sub sound signal) to the other hearing aid. In step ST70, the hearing aid 410 receives the sound command from the other hearing aid. After the processing of step ST70, the hearing aid 410 makes the processing proceed to processing of step ST71.

In step ST71, the hearing aid 410 determines whether the sound command can be recognized. When the sound command can be recognized, in step ST72, the hearing aid 410 executes adjustment parameter calculation processing. In step ST73, the hearing aid 410 executes adjustment parameter reflection processing. After step ST73, the hearing aid 410 makes the processing proceed to sound command end processing of step ST74. When it is determined in step ST71 that the sound command may not be recognized, the hearing aid 410 executes sound command end processing of step ST74 immediately. In the sound command end processing, the hearing aid 410 executes the sound command end processing, for example, processing for returning the switching unit 136 to the side of c.

Next, the hearing aid 410 makes the processing proceed to sound signal processing of step ST75. When it is determined in step ST62 that the input start of the sound command is not instructed, the hearing aid 410 makes the processing proceed to the sound signal processing of step ST75 immediately. In the sound signal processing, the hearing aid 410 executes the sound signal processing to improve hearing and outputs the sound signal to the speaker, by a system not illustrated in the drawings.

Next, the hearing aid 410 makes the processing proceed to sound signal analysis processing of step ST76. In the sound signal analysis processing, the hearing aid 410 executes the sound signal analysis processing to calculate the feature amount used in the adjustment parameter calculation processing. After executing the processing of step ST76, the hearing aid 410 makes the processing proceed to temporary record update processing of step ST77. After the processing of step ST77, in step ST78, the hearing aid 410 ends the processing.

As described above, in the hearing aids 410L and 410R (410*a* and 410*b*) illustrated in FIGS. 21 to 22B, the user can adjust the sound (the volume and the sound quality) in the hearing aids 410L and 410R with a subjective sense with respect to the sound. Even if the user does not have detailed knowledge for a sound, the user can perform desired adjustment. In this case, the user can perform the sound input of the subjectively expressed command and can improve usability. In addition, because processing for obtaining the sound command is executed by only one of the hearing aids 410L and 410R, a processing load and consumption power can be decreased in the other hearing aid.

In the above description, the hearing aids 410L and 410R are connected by wire and can communicate with each other. However, the hearing aids 410L and 410R may perform wireless communication. In this case, a transmitted/received sub sound signal is preferably transmitted in even a narrow communication band by lowering a sampling rate. Associated processing may be designed to be executed with a sound signal of which a sampling rate is lowered.

In the above description, the adjustment parameter is calculated by each hearing aid and is set individually. However, communication may be performed after the adjustment parameter is calculated to become the same setting.

In the above description, after the adjustment parameter is set, the adjustment parameter is not held. However, the adjustment parameter and the feature amount of the sound signal when the adjustment parameter is obtained may be held as a set and the adjustment parameter constituting the set together with the feature amount with the highest correlation among the feature amounts of the input sound signal may be automatically set. The adjustment parameter may be held together with position information of a GPS and the adjustment parameter constituting the set may be set automatically when the position comes close to a position of the position information.

In the above description, the sound command input is instructed to the user by the button operation associated with the hearing aid. However, as described in Japanese Patent Application Laid-Open (JP-A) No. 2011-123751, an input start may be instructed by beating a body of the hearing aid with a prescribed pattern and a command may be input.

5. Fifth Embodiment

Configuration of Communication System

When a user performs a conversion using a channel such as a telephone, as a method to make it easy to hear a sound, an optimally information reduced sound has been processed to fit into a communication band of the channel with a communications apparatus such as a telephone of a partner. However, in the case of the present disclosure, the user transmits an inaudible situation to a calling partner with a subjective sense. At the side of an apparatus of the calling partner, the transmitted subjective sense is appropriately determined and adjustment is made. Thereby, processing can be executed with respect to a sound before information reduction and improvement of hearing according to the demand of the hearing side can be performed.

FIG. 24 illustrates a configuration example of a communication system 50 according to a fifth embodiment. The communication system 50 includes a mobile phone 510A and a mobile phone 510B. In this example, when a speaker of the mobile phone 510A has a conversion with a speaker of the mobile phone 510B, the speaker of the mobile phone 510A displays a menu for adjustment on a screen of the mobile phone 510A to adjust hearing.

When the speaker of the mobile phone 510A selects "indistinct" to adjust hearing, adjustment is performed even at the side of the mobile phone 510A. However, an "indistinct" command is transmitted to the mobile phone 510B. The mobile phone 510B that has received the command adjusts a transmission sound according to a feature of the mobile phone 510B, for example, a bandwidth of the transmission sound, a microphone characteristic for calling, and the received command.

Figure 25:
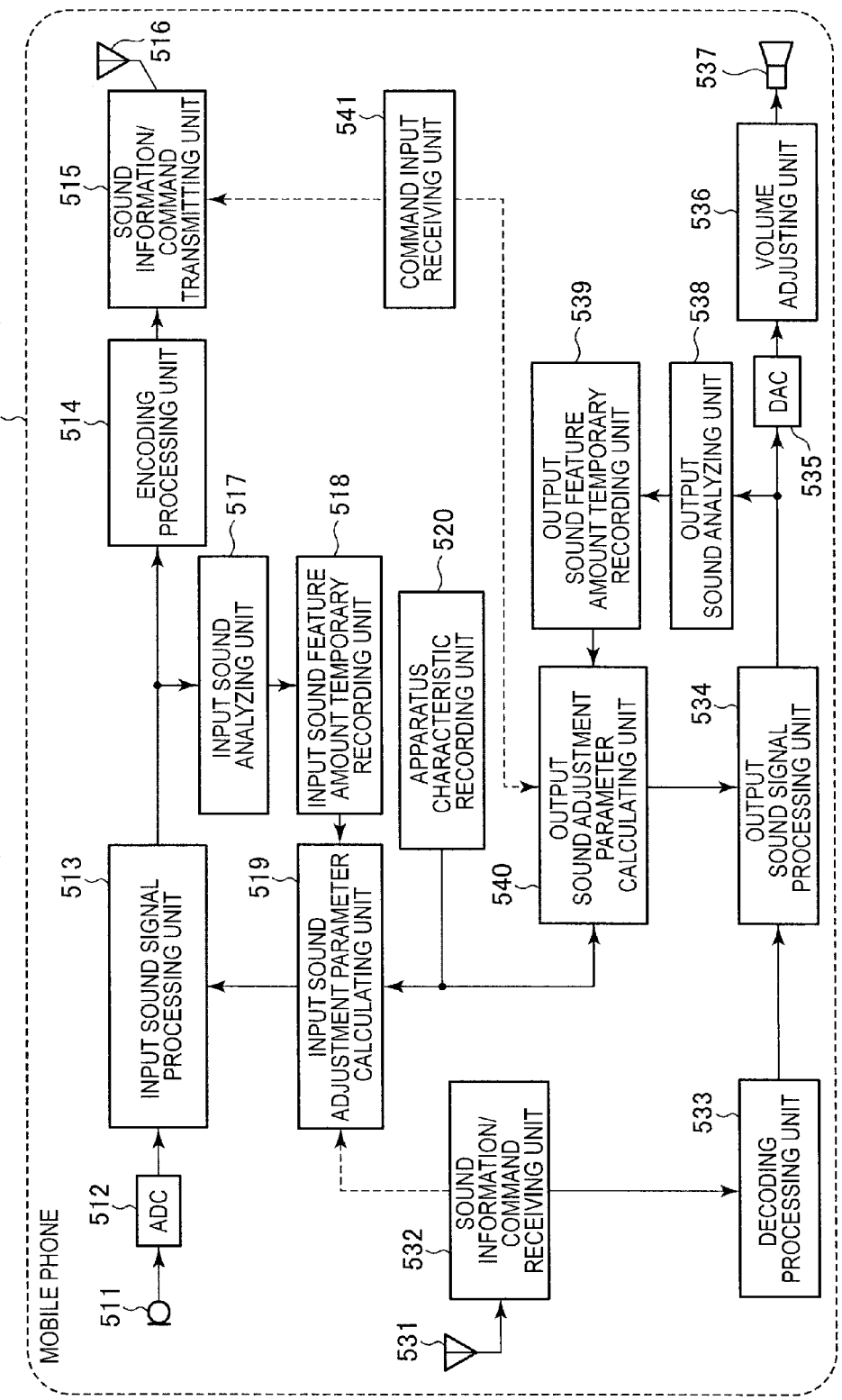
FIG. 25 is a block diagram illustrating a configuration example of a mobile phone.

FIG. 25 illustrates a configuration example of a mobile phone 510 (510A and 510B). In the configuration example, the block diagrams that are illustrated in the example described in the first embodiment in which the sound is picked up by the microphone and is processed and the example described in the second embodiment in which the television receiver (reproduction apparatus) is subjectively adjusted are synthesized and the adjustment command is transmitted from the calling partner.

The mobile phone 510 includes a microphone 511, an A/D converter 512, an input sound signal processing unit 513, an encoding processing unit 514, a sound information/command transmitting unit 515, and an antenna 516. The mobile phone 510 further includes an input sound analyzing unit 517, an input sound feature amount temporary recording unit 518, an input sound adjustment parameter calculating unit 519, and an apparatus characteristic recording unit 520.

The mobile phone 510 further includes an antenna 531, a sound information/command receiving unit 532, a decoding processing unit 533, an output sound signal processing unit 534, a D/A converter 535, a volume adjusting unit 536, and a speaker 537. The mobile phone 510 further includes an output sound analyzing unit 538, an output sound feature amount temporary recording unit 539, an output sound adjustment parameter calculating unit 540, and a command input receiving unit 541.

The microphone 511 picks up an ambient sound and obtains a sound signal. The A/D converter 512 converts the sound signal obtained by the microphone 511 from an analog signal to a digital signal. The input sound signal processing unit 513 executes various processing, for example, AGC processing, noise reduction processing, and sound emphasis processing with respect to the sound signal (sound signal of a processing object) obtained by the A/D converter 512. The encoding processing unit 514 executes encoding processing with respect to the processed sound signal, for communication. The sound information/command transmitting unit 515 transmits the encoded sound signal from the antenna 516 to the channel.

Similar to the sound analyzing unit 117 illustrated in FIG. 2(a), the input sound analyzing unit 517 the input sound analyzing unit 517 executes sound analysis processing with respect to the digital sound signal output from the input sound signal processing unit 513 and acquires a feature amount. Similar to the temporary recording unit 118 illustrated in FIG. 2(a), the input sound feature amount temporary recording unit 518 temporarily records the feature amount acquired by the input sound analyzing unit 517, that is, holds the feature amount during a preset period.

The apparatus characteristic recording unit 520 records a characteristic of the microphone 511 and a characteristic of the speaker 537 as individual parameters. These characteristics are measured in advance and are recorded in the apparatus characteristic recording unit 520. The input sound adjustment parameter calculating unit 519 calculates a parameter to adjust a sound signal (input sound adjustment parameter) in the input sound signal processing unit 513, on the basis of the command acquired by the sound information/command receiving unit 532, the feature amount of the sound signal of the processing object recorded in the input sound feature amount temporary recording unit 518, and the microphone characteristic recorded in the apparatus characteristic recording unit 520.

The sound information/command receiving unit 532 decodes reception information of the antenna 531 and acquires an encoded sound signal or command (adjustment command). The decoding processing unit 533 decodes the encoded sound signal acquired by the sound information/command receiving unit 532 and obtains a reception sound signal. The output sound signal processing unit 534 executes various processing, for example, band expansion processing, speech speed conversion processing, and noise suppression processing with respect to the reception sound signal obtained by the decoding processing unit 533. The D/A converter 535 converts the sound signal output from the output sound signal processing unit 534 from a digital signal to an analog signal. The volume adjusting unit 536 adjusts the volume of the sound signal obtained by the D/A converter 535 with a set value and outputs the sound signal to the speaker 537.

Similar to the sound analyzing unit 117 illustrated in FIG. 2(a), the output sound analyzing unit 538 executes sound analysis processing with respect to the digital sound signal output from the output sound signal processing unit 534 and acquires a feature amount. Similar to the temporary recording unit 118 illustrated in FIG. 2(a), the output sound feature amount temporary recording unit 539 temporarily records the feature amount acquired by the output sound analyzing unit 538, that is, holds the feature amount during a preset period. The output sound adjustment parameter calculating unit 540 calculates an adjustment parameter to adjust a sound signal (output sound adjustment parameter) in the output sound signal processing unit 534, on the basis of the command acquired by the command input receiving unit 541, the feature amount of the sound signal of the processing object recorded in the input sound feature amount temporary recording unit 539, and the speaker characteristic recorded in the apparatus characteristic recording unit 520.

Next, a basic operation of the mobile phone 510 at the time of transmission will be described. The analog sound signal that is obtained by the microphone 511 is converted into a digital sound signal by the A/D converter 512 and is transmitted to the input sound signal processing unit 513. In the input sound signal processing unit 513, prescribed sound processing, for example, noise suppression processing or formant emphasis processing is executed with respect to the transmitted digital sound signal and the digital sound signal is transmitted to the encoding processing unit 514 and the input sound analyzing unit 517.

In the encoding processing unit 514, encoding processing is executed with respect to the transmitted digital sound signal, for communication, and the digital sound signal is transmitted to the sound information/command transmitting unit 515. In the sound information/command transmitting unit 515, the transmitted encoded sound signal is transmitted from the antenna 516 to the channel. Meanwhile, in the input sound analyzing unit 517, analysis processing is executed with respect to the transmitted digital sound signal and the feature amount is calculated. The feature amount is supplied to the input sound feature amount temporary recording unit 518 and is held during a preset period.

Next, a basic operation of the mobile phone 510 at the time of reception will be described. Information that is received by the antenna 531 is transmitted to the sound information/command receiving unit 532. In the sound information/command receiving unit 532, the transmitted information is decoded. The sound signal is transmitted to the decoding processing unit 533 and the adjustment command that is transmitted from the partner side is transmitted to the input sound adjustment parameter calculating unit 519.

In the decoding processing unit 533, the transmitted encoded sound signal is decoded and is transmitted to the output sound signal processing unit 534. In the output sound signal processing unit 534, band expansion processing, speech speed conversion processing, or nose suppression processing is executed with respect to the transmitted digital sound signal and the sound signal is transmitted to the D/A converter 535 and the output sound analyzing unit 538.

In the D/A converter 535, the transmitted digital sound signal is converted into the analog sound signal, the volume is adjusted by the volume adjusting unit 536, and the sound is output from the speaker 537. Meanwhile, in the output sound analyzing unit 538, analysis processing is executed with respect to the transmitted digital sound signal and the feature amount is calculated. The feature amount is supplied to the output sound feature amount temporary recording unit 539 and is held during a preset period.

In the above description, the sound analyzing units 517 and 538 and the temporary recording units 518 and 538 operate at all times, in order to simplify explanation. However, as described in the first embodiment, the sound analyzing units 517 and 538 and the temporary recording units 518 and 538 are not limited to the above configuration.

Next, an operation in the case in which adjustment is performed will be described. A command that is received by the command input receiving unit 541 by touching a button of a subjective sense displayed on a display unit by the user is transmitted to the output sound adjustment parameter calculating unit 540. In the output sound adjustment parameter calculating unit 540, the transmitted command, a time-series record feature amount recorded in the output sound feature amount temporary recording unit 539, and a speaker characteristic recorded in the apparatus characteristic recording unit 520 are obtained and analyzed and an adjustment parameter to adjust the output sound signal processing unit 534 is calculated.

In the output sound adjustment parameter calculating unit 540, when a command "a sound does not hear clearly" is transmitted, the following adjustment parameter is calculated. For example, it is determined whether there is noise, from a cepstrum coefficient recorded in a calculated time-series record feature amount or differential information thereof, and when there is the noise, an adjustment parameter to enhance noise suppression processing is calculated. When a signal is concentrated on a band higher than a sound band, the band higher than the sound band is deleted and an adjustment parameter that seems to be replaced by the band expansion processing is calculated. When a sound can be determined from pitch information, an adjustment parameter that seems to be reproduced late by the speech speed conversion processing is calculated.

The adjustment parameter that is calculated as described above is set to the output sound signal processing unit 534. For this reason, in the output sound signal processing unit 534, each signal processing is adjusted according to the set adjustment parameter. That is, a sound (the volume and the sound quality) of a reception sound signal is adjusted with the adjustment parameter.

The command that is received by the command input receiving unit 541 is transmitted to the sound information/command transmitting unit 515 and is transmitted to the calling partner through the channel. At the side of the calling partner, the transmitted command is received by the antenna 531 and is transmitted to the sound information/command receiving unit 532. In the sound information/command receiving unit 532, the command is extracted and the input sound adjustment parameter is transmitted to the input sound adjustment parameter calculating unit 519.

In the input sound adjustment parameter calculating unit 519, the transmitted command, the time-series record feature amount recorded in the input sound feature amount temporary recording unit 518, and the microphone characteristic recorded in the apparatus characteristic recording unit 520 are acquired and analyzed and an adjustment parameter to adjust the input sound signal processing unit 513 is calculated.

In the input sound adjustment parameter calculating unit 519, when a command "a sound does not hear clearly" is transmitted, the following adjustment parameter is calculated. For example, by suppressing an out-of-band signal of a sound signal from pitch information and executing signal processing for allocating bits with respect to the sound band by the encoding processing, a parameter to adjust band setting of the encoding processing unit 514 is calculated. The microphone sensitivity is lowered, only an ambient sound of the microphone is picked up, and an adjustment parameter to amplify the sound band is calculated by the input sound signal processing unit 513.

As described above, in the communication system 50 illustrated in FIG. 24, because the reception terminal analyzes the transmitted command, a sound adjustment command can be transmitted, even if the apparatus characteristic of the calling partner or the signal processing is unknown. At the reception side, processing can be effectively executed, for example, the noise suppression processing is executed before the encoding processing.

6. Modification

In the embodiments described above, the apparatus may ask the input of the user back. An adjustment condition may be inquired using a sound, for example, "how is it" is first inquired and "a little more than that" is then inquired according to the input of the user. The user may first input a command and then input a command meaning a degree, for example, "further", "a little more strongly", or "a little more weakly". In an apparatus that includes a display unit such as a display or a touch panel, the input may be asked back using the sound and a reaction to which an expression is added may be returned. For example, a face may be displayed by computer graphic (CG) and may be linked or change condition display may be performed.

In the embodiments described above, the feature amount that is obtained by analyzing the sound signal is added and the adjustment parameter corresponding to the command is calculated and used. However, a predetermined adjustment parameter may be selectively extracted from adjustment parameters preset according to a command of a subjective expression and may be used. Even in this case, the user can adjust the sound (the volume and the sound quality) with a subjective sense with respect to the sound. Even if the user does not have detailed knowledge for the sound, the user can perform desired adjustment.

In the embodiments described above, the sound (the volume and the sound quality) in the acoustic apparatus is adjusted with the command of the subjective expression. However, the present disclosure is applicable to adjustment in apparatuses other than the acoustic apparatus. For example, the present disclosure is applicable to adjustment of temperature and humidity in an air conditioner.

Additionally, the present technology may also be configured as below.

(1) A signal processing apparatus including:
a provision control unit that provides choices expressed subjectively and associated with control for an acoustic signal; and
an output unit that outputs a predetermined choice selected from the provided choices.

(2) The signal processing apparatus according to (1),
wherein the provision control unit changes a display aspect of the provided choices, according to the selected choice or a feature amount of an acoustic signal of a processing object.

(3) The signal processing apparatus according to (1) or (2),
wherein the provided choices are subjective senses and/or subjective requests to be handled.

(4) The signal processing apparatus according to any one of (1) to (3), further including:
a calculating unit that calculates an adjustment parameter to adjust an acoustic signal of a processing object, based on individual parameters measured in advance, the selected predetermined choice, and a feature amount of the acoustic signal of the processing object.

(5) The signal processing apparatus according to (4),
wherein the individual parameters are parameters showing aural characteristics.

(6) The signal processing apparatus according to (4) or (5),
wherein the individual parameters are parameters showing characteristics of a microphone and/or a speaker.

(7) A signal processing method including:
providing choices expressed subjectively and associated with control for an acoustic signal; and
outputting a predetermined choice selected from the provided choices.

(8) A program for causing a computer to function as:
a provision control unit that provides choices expressed subjectively and associated with control for an acoustic signal; and
an output unit that outputs a predetermined choice selected from the provided choices.

(9) A signal processing apparatus including:
an acquiring unit that acquires an adjustment parameter calculated based on individual parameters measured in advance, a predetermined choice selected from choices expressed subjectively and associated with control for a provided acoustic signal, and a feature amount of an acoustic signal of a processing object; and
a signal processing unit that adjusts the acoustic signal of the processing object, based on the acquired adjustment parameter.

(10) The signal processing apparatus according to (9),
wherein the signal processing unit has a first buffer and a second buffer that accumulate the adjustment parameter, and
wherein, when the adjustment parameter is acquired by the acquiring unit in a use state of the adjustment parameter accumulated in one buffer, the signal processing unit accumulates the acquired adjustment parameter in another buffer and then switches the use state into a use state of the adjustment parameter accumulated in the another buffer.

(11) The signal processing apparatus according to (10),
wherein the signal processing unit has a buffer that accumulates the adjustment parameter, and
wherein, when the adjustment parameter is acquired by the acquiring unit in a use state of the adjustment parameter accumulated in the buffer, the signal processing unit mutes an output of the adjusted acoustic signal, accumulates the acquired adjustment parameter in the buffer, and then releases muting.

(12) The signal processing apparatus according to any one of (9) to (11), further including:
an analyzing unit that analyzes the acoustic signal of the processing object and calculates a feature amount of the acoustic signal.

(13) The signal processing apparatus according to any one of (9) to (12), further including:
a calculating unit that calculates the adjustment parameter.

(14) A signal processing method including:
acquiring an adjustment parameter calculated based on individual parameters measured in advance, a predetermined choice selected from choices expressed subjectively and associated with control for a provided acoustic signal, and a feature amount of an acoustic signal of a processing object; and
adjusting the acoustic signal of the processing object, based on the acquired adjustment parameter.

(15) A signal processing apparatus including:
an acquiring unit that acquires an adjustment parameter corresponding to a predetermined choice selected from choices expressed subjectively and associated with control for a provided acoustic signal; and
a signal processing unit that adjusts an acoustic signal of a processing object, based on the acquired adjustment parameter.

(16) A signal processing system including:
a provision control unit that provides choices expressed subjectively and associated with control for an acoustic signal;
a calculating unit that calculates an adjustment parameter to adjust an acoustic signal of a processing object, based on individual parameters measured in advance, a predetermined choice selected from the provided choices, and a feature amount of the acoustic signal of the processing object;
a signal processing unit that adjusts the acoustic signal of the processing object, based on the calculated adjustment parameter; and
an output unit that outputs the adjusted acoustic signal.

(17) A signal processing apparatus including:
a sound input unit;
an acquiring unit that acquires a command expressed subjectively and associated with control for an acoustic signal, from a sound input by the sound input unit;
a calculating unit that calculates an adjustment parameter to adjust an acoustic signal of a processing object, based on individual parameters measured in advance, the acquired command, and a feature amount of the acoustic signal of the processing object; and
a signal processing unit that adjusts the acoustic signal of the processing object, based on the calculated adjustment parameter.

(18) The signal processing apparatus according to (17), further including:
a first signal processing system and a second signal processing system each of which includes the sound input unit, the acquiring unit that acquires a command, the calculating unit, and the signal processing unit,
wherein one signal processing system transmits a sound input to the sound input unit to another signal processing system and receives a command from the another signal processing system.

(19) A communication terminal including:

a provision control unit that provides choices expressed subjectively and associated with control for an acoustic signal;

a command output unit that outputs a command corresponding to a predetermined choice selected from the provided choices; and a transmitting unit that transmits the output command to a communication partner.

(20) A communication terminal including:

a receiving unit that receives a command corresponding to a predetermined choice expressed subjectively and associated with control for an acoustic signal, from a communication partner;

an acoustic signal input unit that inputs an acoustic signal;

an adjustment parameter calculating unit that calculates an adjustment parameter, based on at least the received command;

a signal processing unit that adjusts the input acoustic signal, based on the calculated adjustment parameter; and a transmitting unit that transmits the adjusted acoustic signal to the communication partner.

It should be understood by those skilled in the art that various modifications, combinations, sub-combinations and alterations may occur depending on design requirements and other factors insofar as they are in the scope of the appended claims or the equivalents thereof.

The present disclosure contains subject matter related to that disclosed in Japanese Priority Patent Application JP 2012-022536 filed in the Japan Patent Office on Feb. 3, 2012, the entire content of which is hereby incorporated by reference.

What is claimed is:

1. A signal processing apparatus comprising:
circuitry configured to
    display choices expressed subjectively and associated with control for an acoustic signal,
    change a display aspect of one or more of the displayed choices from a first display aspect to a second display aspect, based on a feature amount of the acoustic signal,
    output a predetermined choice selected from the displayed choices, and
    change back from the second display aspect to the first display aspect, after the predetermined choice has been selected from the displayed choices.

2. The signal processing apparatus according to claim 1, wherein the displayed choices are subjective senses and/or subjective requests to be handled.

3. The signal processing apparatus according to claim 1, wherein the circuitry is further configured to
    calculate an adjustment parameter to adjust the acoustic signal of a processing object, based on individual parameters measured in advance, the selected predetermined choice, and the feature amount of the acoustic signal of the processing object.

4. The signal processing apparatus according to claim 3, wherein the individual parameters are parameters showing aural characteristics.

5. The signal processing apparatus according to claim 3, wherein the individual parameters are parameters showing characteristics of a microphone and/or a speaker.

6. The signal processing apparatus according to claim 1, wherein the feature amount corresponds to pitch information included in the acoustic signal, a spectrum position of maximum power of a power spectrum, or a cepstrum coefficient of the power spectrum.

7. A signal processing method comprising:
displaying choices expressed subjectively and associated with control for an acoustic signal;
changing a display aspect of one or more of the displayed choices from a first display aspect to a second display aspect, based on a feature amount of the acoustic signal;
outputting a predetermined choice selected from the displayed choices; and
changing back from the second display aspect to the first display aspect, after the predetermined choice has been selected from the displayed choices.

8. A signal processing apparatus comprising:
circuitry configured to
    change a display aspect of one or more displayed choices that are expressed subjectively and associated with control for a provided acoustic signal of a processing object, based on a feature amount of the provided acoustic signal,
    acquire an adjustment parameter calculated based on individual parameters measured in advance, a displayed choice selected from the displayed choices, and the feature amount of the acoustic signal of the processing object, and
    adjust the acoustic signal of the processing object, based on the acquired adjustment parameter, wherein
    when the adjustment parameter is acquired by the circuitry in a use state of the adjustment parameter accumulated in a first buffer, the circuitry accumulates the acquired adjustment parameter in a second buffer and then switches the use state into a use state of the adjustment parameter accumulated in the second buffer.

9. The signal processing apparatus according to claim 8, wherein the circuitry includes the first buffer and the second buffer that accumulate the adjustment parameter.

10. The signal processing apparatus according to claim 8, wherein the circuitry is further configured to
    analyze the acoustic signal of the processing object and calculate the feature amount of the acoustic signal.

11. The signal processing apparatus according to claim 8, wherein the circuitry is further configured to calculate the adjustment parameter.

12. A signal processing method comprising:
changing a display aspect of one or more displayed choices that are expressed subjectively and associated with control for a provided acoustic signal of a processing object, based on a feature amount of the provided acoustic signal;
acquiring, by circuitry, an adjustment parameter calculated based on individual parameters measured in advance, a displayed choice selected from the displayed choices, and the feature amount of the acoustic signal of the processing object; and
adjusting the acoustic signal of the processing object, based on the acquired adjustment parameter, wherein
when the adjustment parameter is acquired by the acquiring in a use state of the adjustment parameter accumulated in a first buffer, accumulating the acquired adjustment parameter in a second buffer and then switching the use state into a use state of the adjustment parameter accumulated in the second buffer.

* * * * *